US009098154B2

(12) United States Patent
Cok

(10) Patent No.: US 9,098,154 B2
(45) Date of Patent: *Aug. 4, 2015

(54) DISPLAY APPARATUS WITH PIXEL-ALIGNED MICRO-WIRE ELECTRODE

(75) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 146 days.

This patent is subject to a terminal disclaimer.

(21) Appl. No.: 13/587,165

(22) Filed: Aug. 16, 2012

(65) Prior Publication Data

US 2014/0049504 A1 Feb. 20, 2014

(51) Int. Cl.
*G06F 3/044* (2006.01)
*G06F 3/041* (2006.01)
*G02F 1/1333* (2006.01)
*H01L 27/32* (2006.01)

(52) U.S. Cl.
CPC .............. *G06F 3/044* (2013.01); *G06F 3/0412* (2013.01); *H01L 27/3276* (2013.01); *H01L 27/3288* (2013.01); *G02F 1/13338* (2013.01)

(58) Field of Classification Search
CPC ................. G06F 3/0412; G06F 3/044; G06F 2203/04104; G06F 2203/04107; G06F 2203/04111; G06F 2203/04112; G02F 1/13338
USPC .................................................. 345/173, 174
See application file for complete search history.

(56) References Cited

U.S. PATENT DOCUMENTS

| | | | |
|---|---|---|---|
| 3,223,525 A | 12/1965 | Jonker et al. | |
| 6,501,529 B1 * | 12/2002 | Kurihara et al. | 349/160 |
| 6,645,444 B2 | 11/2003 | Goldstein | |
| 6,812,637 B2 | 11/2004 | Cok et al. | |
| 7,663,607 B2 | 2/2010 | Hotelling et al. | |
| 2006/0057502 A1 | 3/2006 | Okada et al. | |
| 2008/0314626 A1 * | 12/2008 | Moore | 174/255 |
| 2010/0026664 A1 * | 2/2010 | Geaghan | 345/174 |
| 2010/0302201 A1 | 12/2010 | Ritter et al. | |
| 2011/0007011 A1 | 1/2011 | Mozdzyn | |
| 2011/0099805 A1 | 5/2011 | Lee | |
| 2011/0102361 A1 * | 5/2011 | Philipp | 345/174 |
| 2011/0210935 A1 * | 9/2011 | Chuang | 345/174 |
| 2011/0289771 A1 | 12/2011 | Kuriki | |
| 2011/0291966 A1 | 12/2011 | Takao et al. | |
| 2012/0031746 A1 | 2/2012 | Hwang et al. | |
| 2012/0162109 A1 * | 6/2012 | Sasaki | 345/173 |

(Continued)

*Primary Examiner* — Dwayne Bost
*Assistant Examiner* — Stefan M Oehrlein
(74) *Attorney, Agent, or Firm* — Raymond L. Owens

(57) ABSTRACT

A display apparatus includes a display having an array of pixels formed in rows and columns, the pixels in a row separated by column inter-pixel gaps and the pixels in a column separated by row inter-pixel gaps. A touch screen includes a dielectric layer located over the display with row electrodes and column electrodes formed on opposite sides of the dielectric layer. The row electrodes include a plurality of electrically connected row micro-wires formed in a row micro-pattern over the array of pixels, the row micro-wires located between the pixels in the row inter-pixel gaps and substantially extending continuously along the row electrode length. The column electrodes include a plurality of electrically connected column micro-wires formed in a column micro-pattern over the array of pixels, the column micro-wires located between the pixels in the column inter-pixel gaps and substantially extending continuously along the column electrode length.

20 Claims, 24 Drawing Sheets

(56) References Cited

U.S. PATENT DOCUMENTS

| | | |
|---|---|---|
| 2012/0162116 A1 | 6/2012 | Philipp |
| 2013/0009905 A1* | 1/2013 | Castillo et al. ............... 345/174 |
| 2013/0127739 A1* | 5/2013 | Guard et al. ............... 345/173 |
| 2013/0278513 A1* | 10/2013 | Jang ............... 345/173 |
| 2014/0049503 A1* | 2/2014 | Cok ............... 345/174 |
| 2014/0055403 A1* | 2/2014 | Cok ............... 345/174 |

* cited by examiner

DISPLAY APPARATUS WITH PIXEL-ALIGNED MICRO-WIRE ELECTRODE

CROSS REFERENCE TO RELATED APPLICATIONS

Reference is made to commonly assigned U.S. patent application Ser. No. 13/571,704 filed Aug. 10, 2012, entitled "Micro-Wire Electrode Pattern" by Ronald S. Cok; U.S. patent application Ser. No. 13/587,152 filed concurrently herewith, entitled "Pixel-Aligned Micro-Wire Electrode Device" by Ronald S. Cok; and U.S. patent application Ser. No. 13/587,185 filed concurrently herewith, entitled "Making Display Device With Pixel-Aligned Micro-Wire Electrode" by Ronald S. Cok the disclosures of which are incorporated herein.

FIELD OF THE INVENTION

The present invention relates to micro-wire transparent electrodes and their use in a capacitive touch-screen display apparatus.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Touch screens with transparent electrodes are widely used with electronic displays, especially for mobile electronic devices. Such devices typically include a touch screen mounted over an electronic display that displays interactive information. Touch screens mounted over a display device are largely transparent so a user can view displayed information through the touch-screen and readily locate a point on the touch-screen to touch and thereby indicate the information relevant to the touch. By physically touching, or nearly touching, the touch screen in a location associated with particular information, a user can indicate an interest, selection, or desired manipulation of the associated particular information. The touch screen detects the touch and then electronically interacts with a processor to indicate the touch and touch location. The processor can then associate the touch and touch location with displayed information to execute a programmed task associated with the information. For example, graphic elements in a computer-driven graphic user interface are selected or manipulated with a touch screen mounted on a display that displays the graphic user interface.

Touch screens use a variety of technologies, including resistive, inductive, capacitive, acoustic, piezoelectric, and optical technologies. Such technologies and their application in combination with displays to provide interactive control of a processor and software program are well known in the art. Capacitive touch-screens are of at least two different types: self-capacitive and mutual-capacitive. Self-capacitive touch-screens employ an array of transparent electrodes, each of which in combination with a touching device (e.g. a finger or conductive stylus) forms a temporary capacitor whose capacitance is detected. Mutual-capacitive touch-screens can employ an array of transparent electrode pairs that form capacitors whose capacitance is affected by a conductive touching device. In either case, each capacitor in the array is tested to detect a touch and the physical location of the touch-detecting electrode in the touch-screen corresponds to the location of the touch. For example, U.S. Pat. No. 7,663,607 discloses a multipoint touch-screen having a transparent capacitive sensing medium configured to detect multiple touches or near touches that occur at the same time and at distinct locations in the plane of the touch panel and to produce distinct signals representative of the location of the touches on the plane of the touch panel for each of the multiple touches. The disclosure teaches both self- and mutual-capacitive touch-screens.

Referring to FIG. 20, a prior-art display and touch-screen apparatus 100 includes a display 110 with a corresponding touch screen 120 mounted with the display 110 so that information displayed on the display 110 can be viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the x dimension on the first transparent substrate 122 and a second transparent substrate 126 with second transparent electrodes 132 formed in the y dimension facing the x-dimension first transparent electrodes 130 on the second transparent substrate 126. A dielectric layer 124 is located between the first and second transparent substrates 122, 126 and first and second transparent electrodes 130, 132. Referring also to the plan view of FIG. 21, in this example first pad areas 128 in the first transparent electrodes 130 are located adjacent to second pad areas 129 in the second transparent electrodes 132. (The first and second pad areas 128, 129 are separated into different parallel planes by the dielectric layer 124.) The first and second transparent electrodes 130, 132 have a variable width and extend in orthogonal directions (for example as shown in U.S. Patent Application Publication Nos. 2011/0289771 and 2011/0099805). When a voltage is applied across the first and second transparent electrodes 130, 132, electric fields are formed between the first pad areas 128 of the x-dimension first transparent electrodes 130 and the second pad areas 129 of the y-dimension second transparent electrodes 132.

A display controller 142 (FIG. 20) connected through electrical buss connections 136 controls the display 110 in cooperation with a touch-screen controller 140. The touch-screen controller 140 is connected through electrical buss connections 136 and wires 134 and controls the touch screen 120. The touch-screen controller 140 detects touches on the touch screen 120 by sequentially electrically energizing and testing the x-dimension first and y-dimension second transparent electrodes 130, 132.

Referring to FIG. 22, in another prior-art embodiment, rectangular first and second transparent electrodes 130, 132 are arranged orthogonally on first and second transparent substrates 122, 126 with intervening dielectric layer 124, forming touch screen 120 which, in combination with the display 110 forms the touch screen 120 and display apparatus 100. In this embodiment, first and second pad areas 128, 129 coincide and are formed where the first and second transparent electrodes 130, 132 overlap. The touch screen 120 and display 110 are controlled by touch screen and display controllers 140, 142, respectively, through electrical busses 136 and wires 134.

Since touch-screens are largely transparent, any electrically conductive materials located in the transparent portion of the touch-screen either employ transparent conductive materials or employ conductive elements that are too small to be readily resolved by the eye of a touch-screen user. Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. However, the current-carrying capacity of such electrodes is limited, thereby limiting the amount of power that can be supplied to the pixel elements. Moreover, the substrate materials are limited by the electrode material deposition process (e.g. sputtering). Thicker layers of metal oxides or metals increase conductivity but reduce the transparency of the electrodes.

Various methods of improving the conductivity of transparent conductors are taught in the prior art. For example, U.S. Pat. No. 6,812,637, describes an auxiliary electrode to improve the conductivity of the transparent electrode and enhance the current distribution. Such auxiliary electrodes are typically provided in areas that do not block light emission, e.g., as part of a black-matrix structure.

It is also known in the prior art to form conductive traces using nano-particles including, for example silver. The synthesis of such metallic nano-crystals is known. For example, U.S. Pat. No. 6,645,444. U.S. Patent Application Publication No. 2006/0057502 describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains. However, such wires are not transparent and thus the number and size of the wires limits the substrate transparency as the overall conductivity of the wires increases.

Touch-screens including very fine patterns of conductive elements, such as metal wires or conductive traces are known. For example, U.S. Patent Application Publication No. 2011/0007011 teaches a capacitive touch screen with a mesh electrode, as does U.S. Patent Application Publication No. 2010/0026664. Referring to FIG. 23, a prior-art x- or y-dimension variable-width first or second transparent electrode 130, 132 includes a micro-pattern 156 of micro-wires 150 arranged in a rectangular grid or mesh. The micro-wires 150 are multiple very thin metal conductive traces or wires formed on the first and second transparent substrates 122, 126 (not shown in FIG. 23) to form the x- or y-dimension first or second transparent electrodes 130, 132. The micro-wires 150 are so narrow that they are not readily visible to a human observer, for example 1 to 10 microns wide. The micro-wires 150 are typically opaque and spaced apart, for example by 50 to 500 microns, so that the first or second transparent electrodes 130, 132 appear to be transparent and the micro-wires 150 are not distinguished by an observer.

It is known that micro-wire electrodes in a touch-screen can visibly interact with pixels in a display and various layout designs are proposed to avoid such visible interaction. Thus, the pattern of micro-wires in a transparent electrode is important for optical as well as electrical reasons.

A variety of layout patterns are known for micro-wires used in transparent electrodes. U.S. Patent Application Publication 2010/0302201 teaches that a lack of optical alignment between the rows and columns of the underlying LCD pixels and the overlying diamond-shaped electrodes having edges arranged at 45 degree angles with respect to the underlying rectangular grid of LCD pixels results in a touch-screen largely free from the effects of Moiré patterns or other optical interference effects that might otherwise arise from light reflecting, scattering, refracting or otherwise interacting between the underlying pattern of LCD pixels and the overlying pattern of drive and sense electrodes in undesired or unexpected ways.

U.S. Patent Application Publication No. 2012/0031746 discloses a number of micro-wire electrode patterns, including regular and irregular arrangements. The conductive pattern of micro-wires in a touch screen can be formed by closed figures distributed continuously in an area of 30% or more, preferably 70% or more, and more preferably 90% or more of an overall area of the substrate and can have a shape where a ratio of standard deviation for an average value of areas of the closed figures (a ratio of area distribution) can be 2% or more. As a result, a Moiré phenomenon can be prevented and excellent electric conductivity and optical properties can be satisfied. U.S. Patent Application Publication No. 2012/0162116 discloses a variety of micro-wire patterns configured to reduce or eliminate interference patterns.

U.S. Patent Application Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counterclockwise directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 24, this prior-art design includes micro-wires 150 arranged in a micro-pattern 156 with the micro-wires 150 oriented at an angle to the direction of horizontal first transparent electrodes 130 and vertical second transparent electrodes 132.

Mutual-capacitive touch screens typically include arrays of capacitors whose capacitance is repeatedly tested to detect a touch. In order to detect touches rapidly, highly conductive electrodes are useful. In order to readily view displayed information on a display at a display location through a touch screen without visibly affecting any light emitted from an underlying display, it is useful to have a highly transparent touch screen. There is a need, therefore, for an improved method and device for providing electrodes with increased conductivity and transparency in a mutually capacitive touch-screen device.

SUMMARY OF THE INVENTION

In accordance with the present invention, a display apparatus comprises:

a display including an array of pixels formed in rows and columns, the pixels in a row separated by column inter-pixel gaps and the pixels in a column separated by row inter-pixel gaps;

a touch-screen including a dielectric layer located over the display, the touch screen having row electrodes located on a row side of the dielectric layer and column electrodes located on a column side of the dielectric layer, the row and column electrodes separated by the dielectric layer;

wherein the row electrodes include a plurality of electrically connected row micro-wires formed in a row micro-pattern over the array of pixels, the row micro-wires located between the pixels in the row inter-pixel gaps and substantially extending continuously along the row electrode length; and wherein the column electrodes include a plurality of electrically connected column micro-wires formed in a column micro-pattern over the array of pixels, the column micro-wires located between the pixels in the column inter-pixel gaps and substantially extending continuously along the column electrode length.

The present invention provides a display and touch screen device with improved transparency and conductivity with fewer or no visible interactions with light emitted or reflected from display pixels. Methods of making the device provide integrated structures with reduced thickness and improved transparency. The device of the present invention is particularly useful in capacitive touch screen devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

The Figures are not drawn to scale since the variation in size of various elements in the Figures is too great to permit depiction to scale.

DETAILED DESCRIPTION OF THE INVENTION

Figure 1:
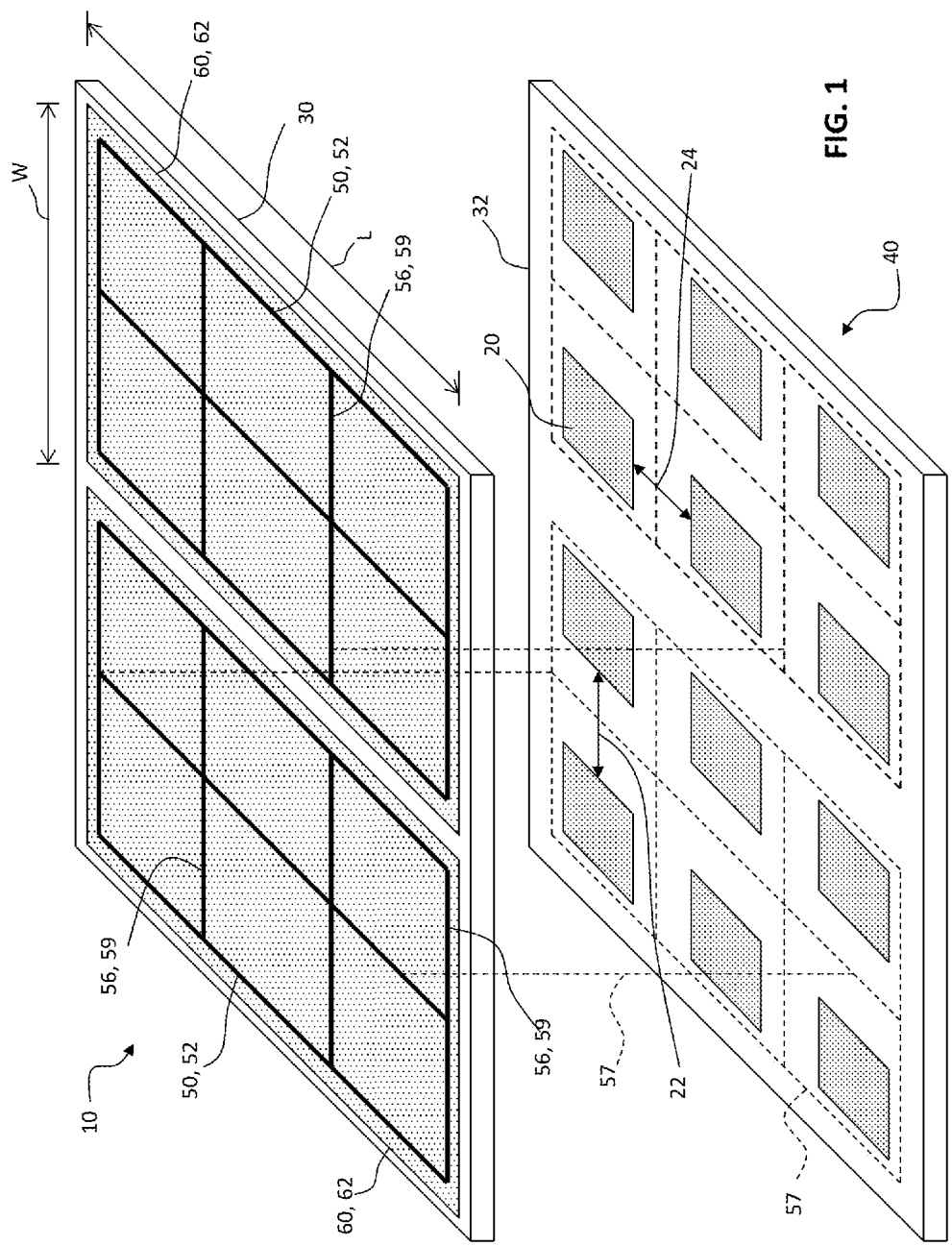
FIG. 1 is an exploded perspective of an embodiment of the present invention.

Referring to FIG. 1 in an embodiment of the present invention, a display device 10 includes a display 40 having an array of pixels 20. The pixels 20 are separated by column inter-pixel gaps 22 between columns of pixels 20 and row inter-pixel gaps 24 between rows of pixels 20. An electrode 60 having a length L and width W is located over display 40 and extends across at least a portion of the array of pixels 20. Electrode 60 includes a plurality of electrically connected micro-wires formed in a micro-pattern. The micro-pattern includes gap micro-wires 50 located between pixels 20 in column inter-pixel gaps 22 or row inter-pixel gaps 24. Gap micro-wires 50 substantially extend continuously along electrode length L.

The rows and column of pixels 20 illustrated in FIG. 1 are shown in straight lines. However, in other embodiments of the present invention, the rows and columns can be arranged so that pixels 20 in rows or columns can be offset with respect to each other so that rows or columns need not be straight. Likewise, electrode 60 and gap micro-wires 50 are shown as straight, but need not be.

Figure 2:
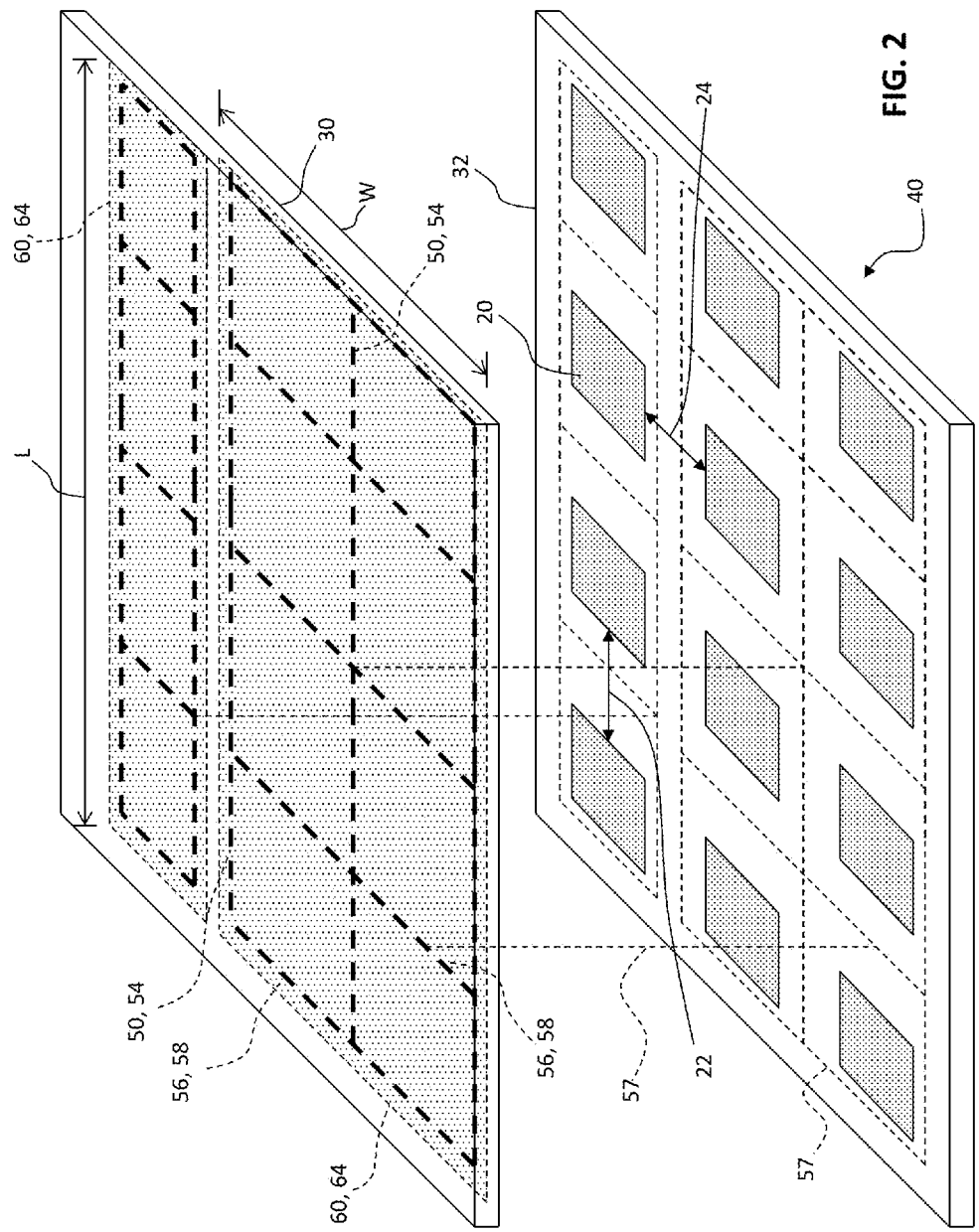
FIG. 2 is an exploded perspective of an alternative embodiment of the present invention.

Gap micro-wires 50 are located in row or column inter-pixel gaps 22, 24. In FIG. 1, length L of electrode 60 is in the column direction and electrode 60 extending in the column direction is also referred to herein as a column electrode 62. Gap micro-wires 50 located in column inter-pixel gaps 22 are referred to herein as column micro-wires 52. Referring to FIG. 2, length L of electrode 60 is in the row direction and electrode 60 extending in the row direction is also referred to herein as a row electrode 64. Gap micro-wires 50 located in row inter-pixel gaps 24 are referred to herein as row micro-wires 54.

By substantially extending continuously along electrode length L is meant that gap micro-wires 50 form an electrically connected electrical conductor from one end of electrode 60 to another end of electrode 60. Gap micro-wires 50 are electrically continuous but not necessarily straight and can include segments having different orientations that are in column or row inter-pixel gaps 22, 24. Electrodes (e.g. electrodes 60) are intended to conduct electricity from a first location on a substrate 30 to a second location on substrate 30. By substantially along length L of electrode 60 is meant that electricity is conducted by gap micro-wires 50 from the first location to the second location. Manufacturing tolerances and layout restrictions can affect the extent and location of micro-wires on a substrate and micro-wires having such limitations are considered to be within the scope of the present invention.

As will be readily understood by those familiar with the lithographic and display design arts, the terms row and column are arbitrary designations of two different, usually orthogonal dimensions in a two-dimensional arrangement of pixels on a surface, for example a substrate surface) and can be exchanged. That is, a row can be considered as a column and a column considered as a row simply by rotating the surface ninety degrees with respect to a viewer. Hence, row electrode 64 can be interchanged with column electrode 62 and column electrode 62 can be interchanged with row electrode 64 depending on the direction of their arrangements on a surface (e.g. substrate 30 surface and display substrate 32 surface). Similarly, row and column micro-wires 54, 52 are designated in correspondence to row and column electrodes 64, 62, as are row and column inter-pixel gaps 24, 22. Row electrode 64 is an electrode 60 that extends in the row direction and column electrode 62 is an electrode 60 that extends in the column direction. Row micro-wire 54 is a micro-wire 50 that extends in the row direction in row inter-pixel gap 24 and column micro-wire 52 is a micro-wire 50 that extends in the column direction in column inter-pixel gap 22.

To provide electrical continuity between column micro-wires 52 in column electrode 62, additional gap micro-wires 56 can be provided in row inter-pixel gaps 24 (FIG. 1) as additional row micro-wires 59. To provide electrical continuity between row micro-wires 54 in row electrode 64, additional gap micro-wires 56 can be provided in column inter-pixel gaps 22 (FIG. 2) as additional column micro-wires 58. Additional gap micro-wires 56 also provide electrical robustness in the presence of breaks in the micro-wires, for example due to use or manufacturing errors.

Gap micro-wires 50 and additional gap micro-wires 56 can be formed in a plane separate from pixels 20. Thus, to be formed in an inter-pixel gap means that the location of gap and additional gap micro-wires 50, 56 are projected orthogonally from the surface in or on which the gap and additional gap micro-wires 50, 56 are formed onto a surface on which the pixels 20 are formed and between but not over the pixels 20 so that gap micro-wires 50 and additional gap micro-wires 56 do not occlude any light emitted or reflected by pixels 20. As illustrated in FIGS. 1 and 2, virtual micro-pattern projection lines 57 illustrate the location of gap micro-wires 50 projected on the surface on which the pixels 20 are formed. Micro-pattern projection lines 57 indicate locations between pixels 20 in column inter-pixel gaps 22 and row inter-pixel gaps 24. In FIG. 1, column micro-wires 52 and additional row micro-wires 59 of column electrode 62 are located between pixels 20 in column inter-pixel gaps 22 and row micro-wire gaps 24 while row micro-wires 54 and row electrode 64 are not illustrated. In FIG. 2, row micro-wires 54 and additional column micro-wires 58 of row electrode 64 are located between pixels 20 in row inter-pixel gaps 24 and column inter-pixel gaps 22 while column micro-wires 52 and column electrode 62 are not illustrated. (FIG. 14, discussed below, illustrates both row and column electrodes 64, 62 and row and column micro-wires 54, 52.)

Because gap micro-wires 50 and additional gap micro-wires 56 do not occlude any light emitted or reflected by pixels 20, row and column electrodes 62, 64 are apparently transparent, thus improving the visual transparency of a device or device formed with such electrodes 60 and avoiding any visible interaction between electrodes 60 and light emitted or reflected from display 40 located behind or under electrodes 60. Furthermore, electrodes 60 can have a width equal to (or less than) the inter-pixel gaps (e.g. column or row inter-pixel gaps 22, 24) in which they are formed, thereby increasing the conductivity of gap micro-wires 50 and the electrical performance of electrodes 60.

Figure 3:
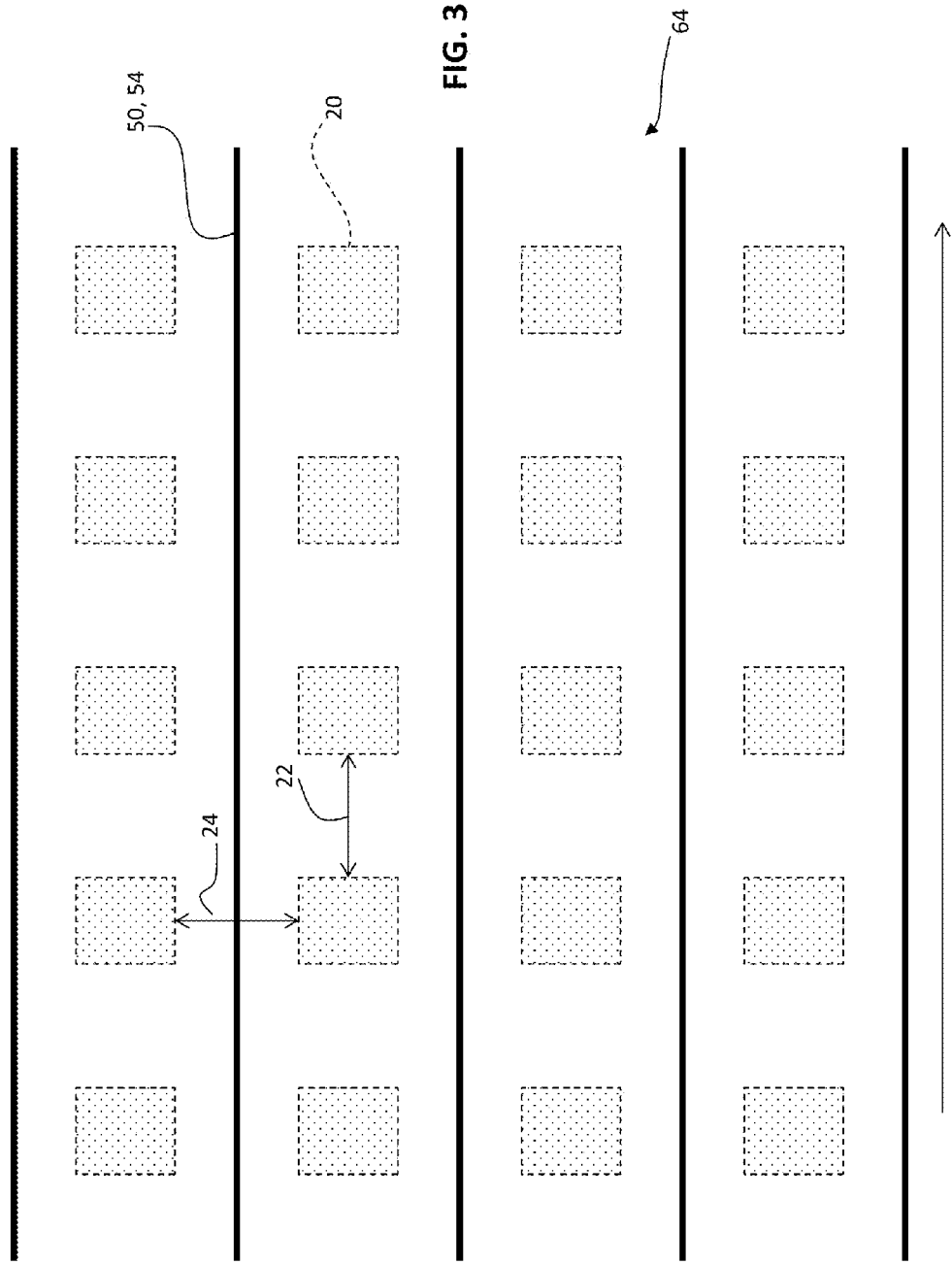
FIGS. 3-13 are plan views of various electrodes illustrating a corresponding variety of embodiments of the present invention.
Figure 4:
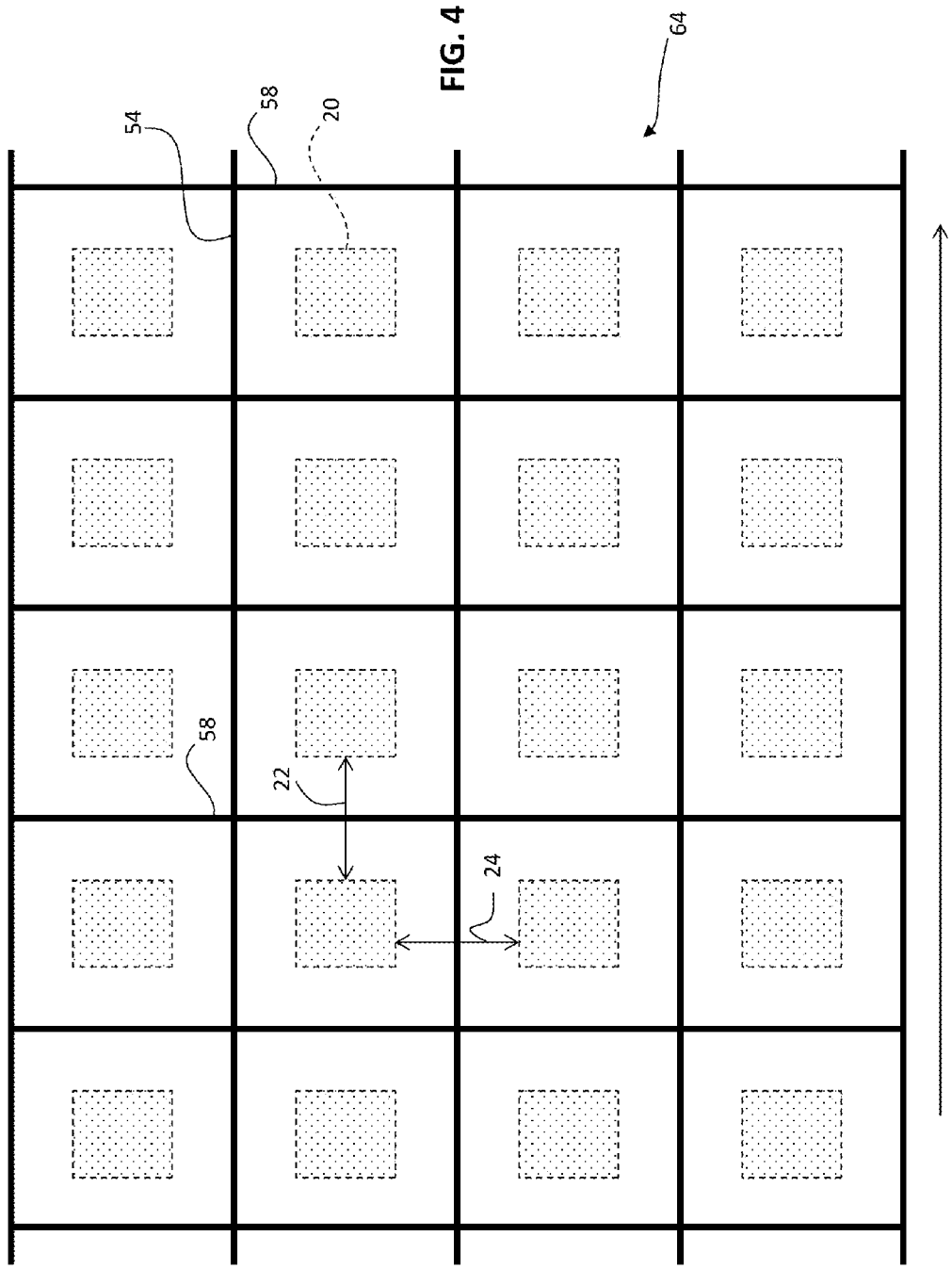

As shown in FIG. 1, column micro-wires 52 can extend continuously along column electrode 62 length L and form a straight line. Likewise, as shown in FIG. 2, row micro-wires 54 can extend continuously along row electrode 64 length L and form a straight line. This is illustrated further in FIG. 3, in which row micro-wires 54 are located in row inter-pixel gaps 24 between rows of pixels 20 to form row electrode 64 extending in the direction illustrated by the arrow. As shown further in FIG. 4, additional column micro-wires 58 are located in column inter-pixel gap 22. Row micro-wires 54 and additional column micro-wires 58 form a rectangular micro-wire conductive mesh or conductive rectangular grid having gap micro-wires 50 located between pixels 20 of an array of pixels 20 that make up row electrode 64. A ninety-degree rotation of the row electrode 64 elements forms a similar column electrode 62 having a micro-wire conductive mesh or conductive rectangular grid with column micro-wires 52 in column inter-pixel gaps 22 and additional row micro-wires 59 in row inter-pixel gaps 24. As noted above, the designation of 'row' and 'column' are arbitrary and can be exchanged and the illustration of FIG. 4 could represent either column electrode 62 or row electrode 64.

Figure 5:
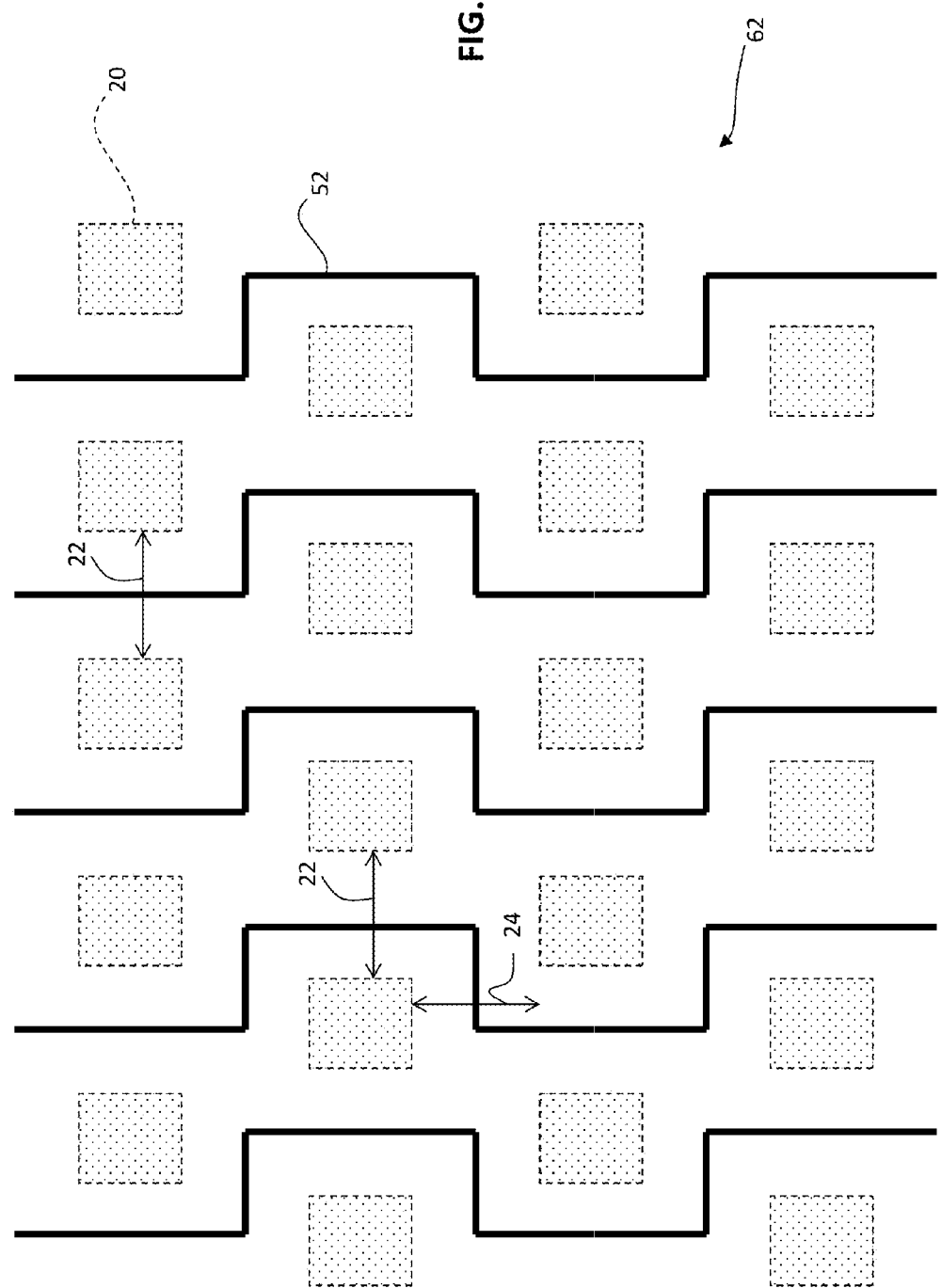
Figure 6:
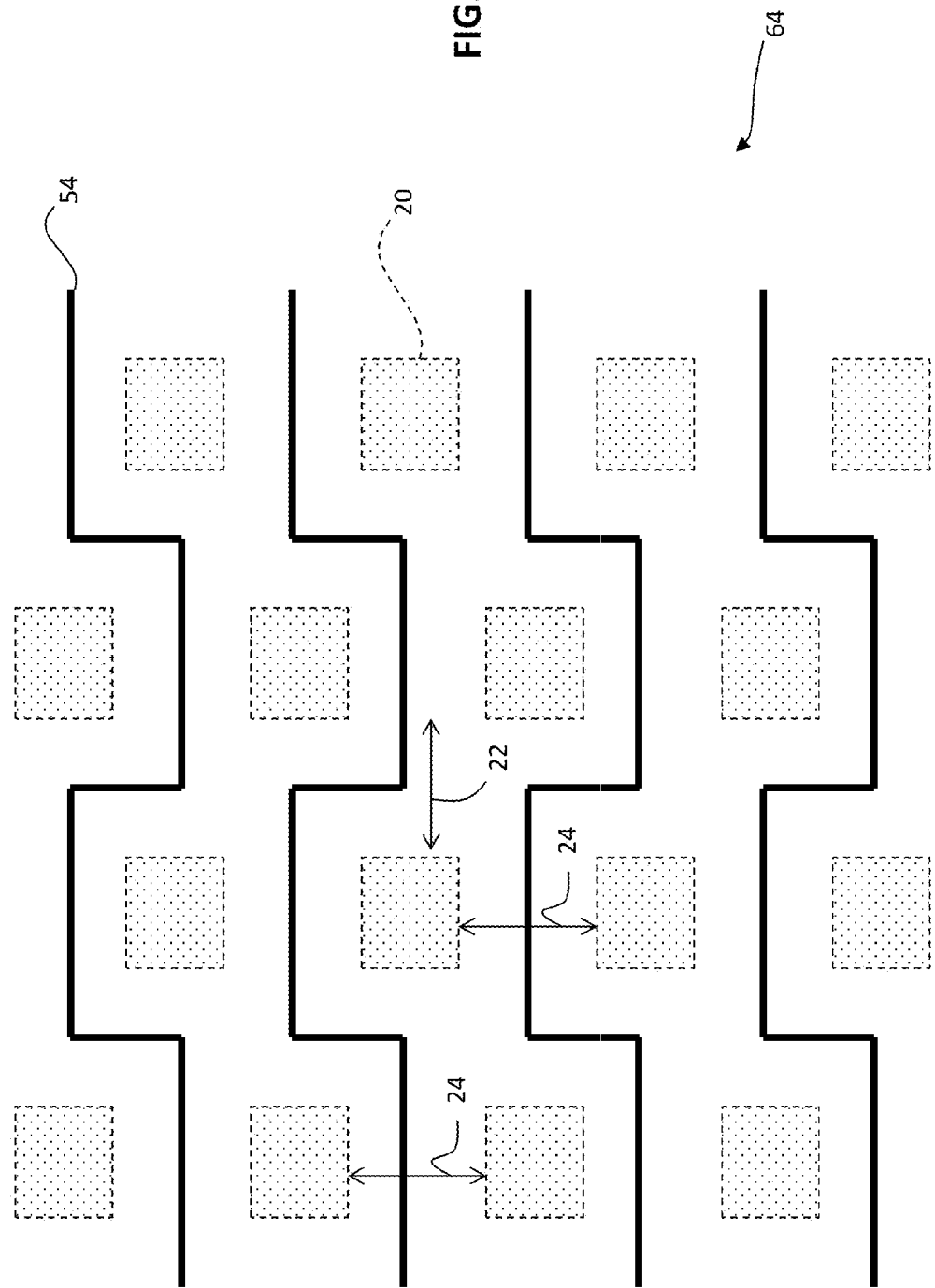
Figure 7:
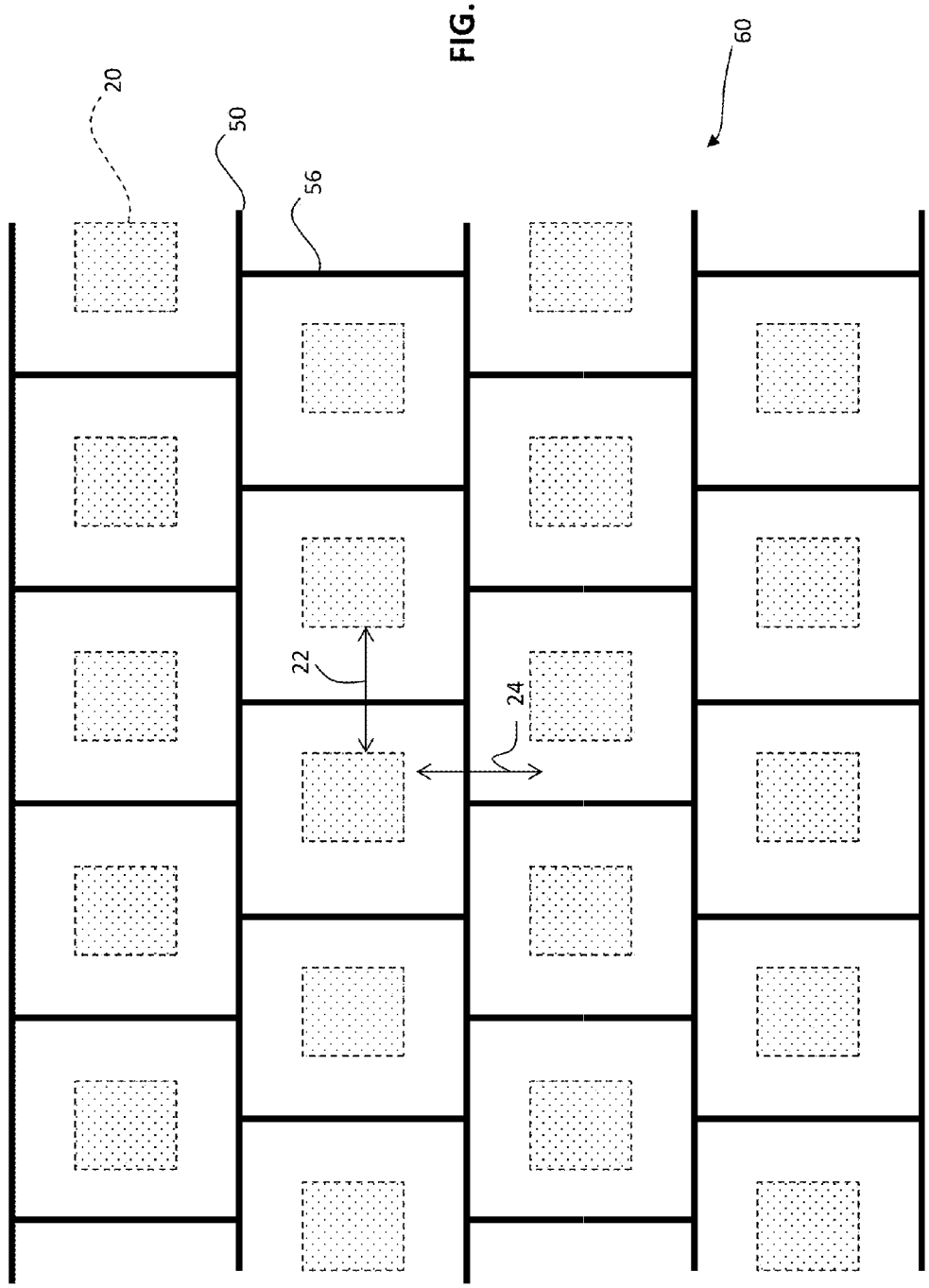
Figure 8:
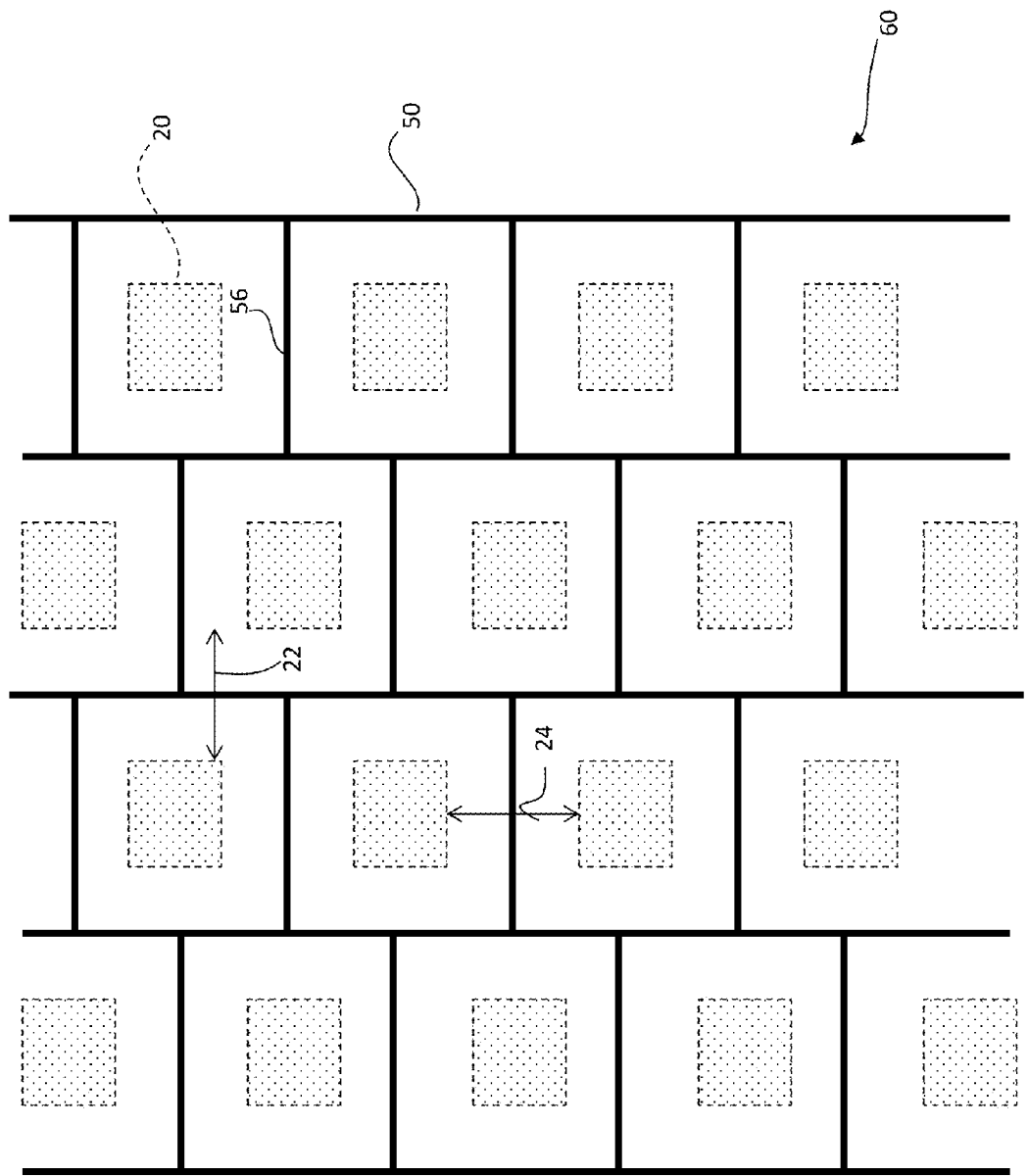

Row electrode 64 and column electrode 62 can, but need not, form a straight line. As illustrated in FIG. 5, alternating rows of pixels 20 are offset so that the column of pixels 20 does not form a straight line but rather forms a crenellated pattern similar to a square wave. According to an embodiment of the present invention, column micro-wires 52 extending continuously along the electrode length formed in column inter-pixel gaps 22 likewise form a crenellated pattern similar to a square wave. Referring to FIG. 6, a similar arrangement is illustrated for offset columns. As illustrated in FIG. 6, alternating columns of pixels 20 are offset so that the row of pixels 20 does not form a straight line but rather forms a crenellated pattern similar to a square wave. According to an embodiment of the present invention, row micro-wires 54 extending continuously along the electrode length formed in row inter-pixel gaps 24 likewise form a crenellated pattern similar to a square wave. As shown in FIGS. 7 and 8, gap micro-wires 50 can be supplemented with additional gap micro-wires 56 to form a conductive mesh of micro-wires in column or row inter-pixel gaps 22, 24 between pixels 20 forming electrodes 60.

As illustrated in FIGS. 7 and 8, the designation of gap micro-wire 50 and additional gap micro-wire 56 is arbitrary. In these Figures, the straight micro-wires could be the gap micro-wires 50 and the offset micro-wires forming a crenellated micro-pattern could be the additional gap micro-wires 56. Alternatively, the offset micro-wires forming a crenellated micro-pattern could be the gap micro-wires 50 and the straight micro-wires could be the additional gap micro-wires 56. Likewise, the electrodes 60 could be either a row or a column electrode 64, 62. However, the conductivity of electrode 60 will be greater in the direction of the straight micro-wires since the conductive path is shorter so that electrodes 60 will be anisotropically conductive.

Figure 9:
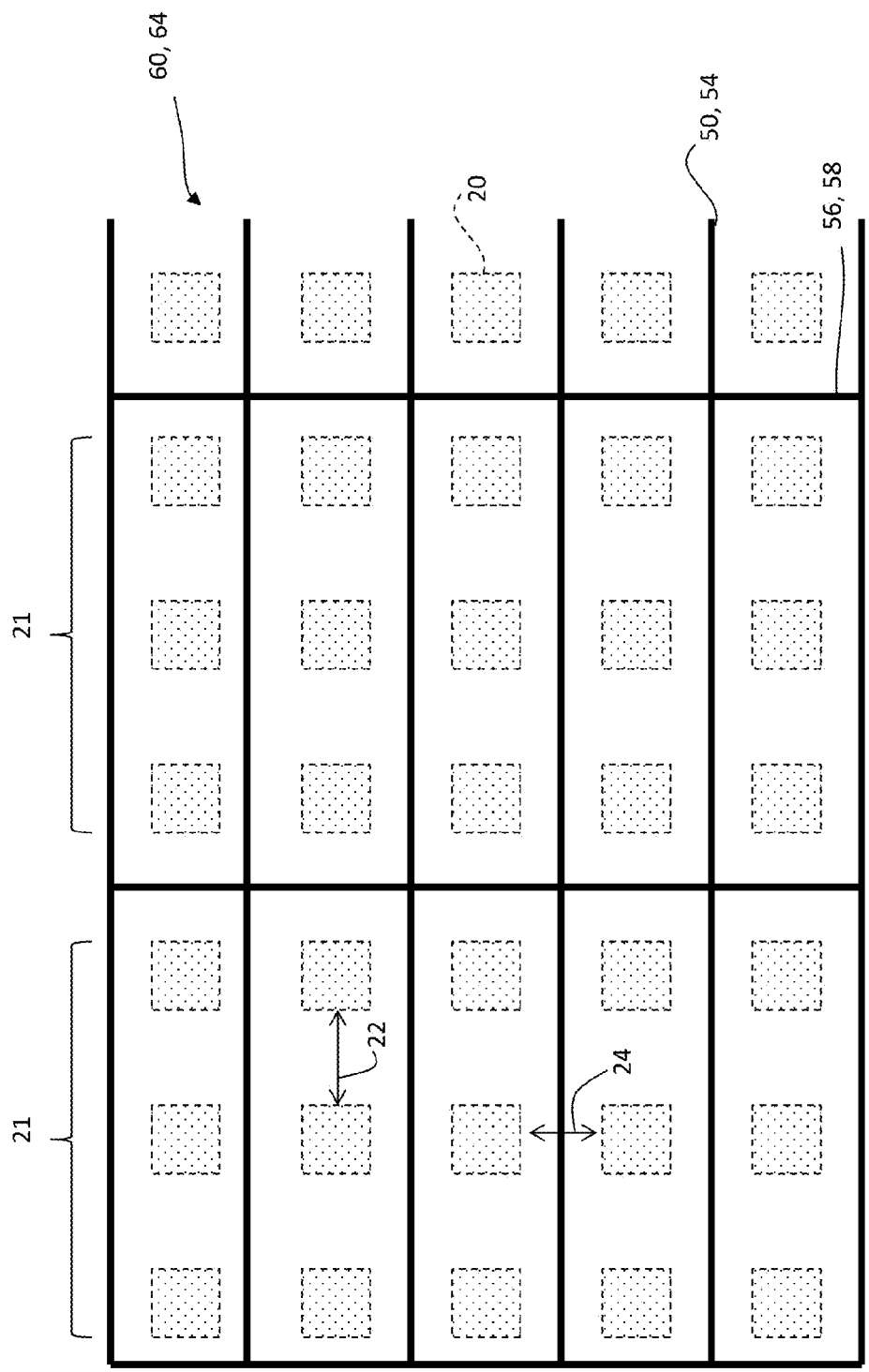

Referring to FIG. 9, in a further embodiment of the present invention, pixels 20 are grouped and gap micro-wires 50 are located between the groups of pixels 21 in row and column inter-pixel gaps 24, 22 but not between pixels 20 within pixel group 21 in at least one dimension. As shown in FIG. 9, the pixel groupings include three adjacent pixels within a row. Alternatively, three adjacent pixels in a column could form pixel group 21, or a two-by-two array of four pixels could form pixel group 21 (not shown). Other arrangements are possible and are included in the present invention. The present invention is not limited by the arrangement of pixels 20 in pixel group 21 or the number of pixels 20 in pixel group 21.

Figure 10:
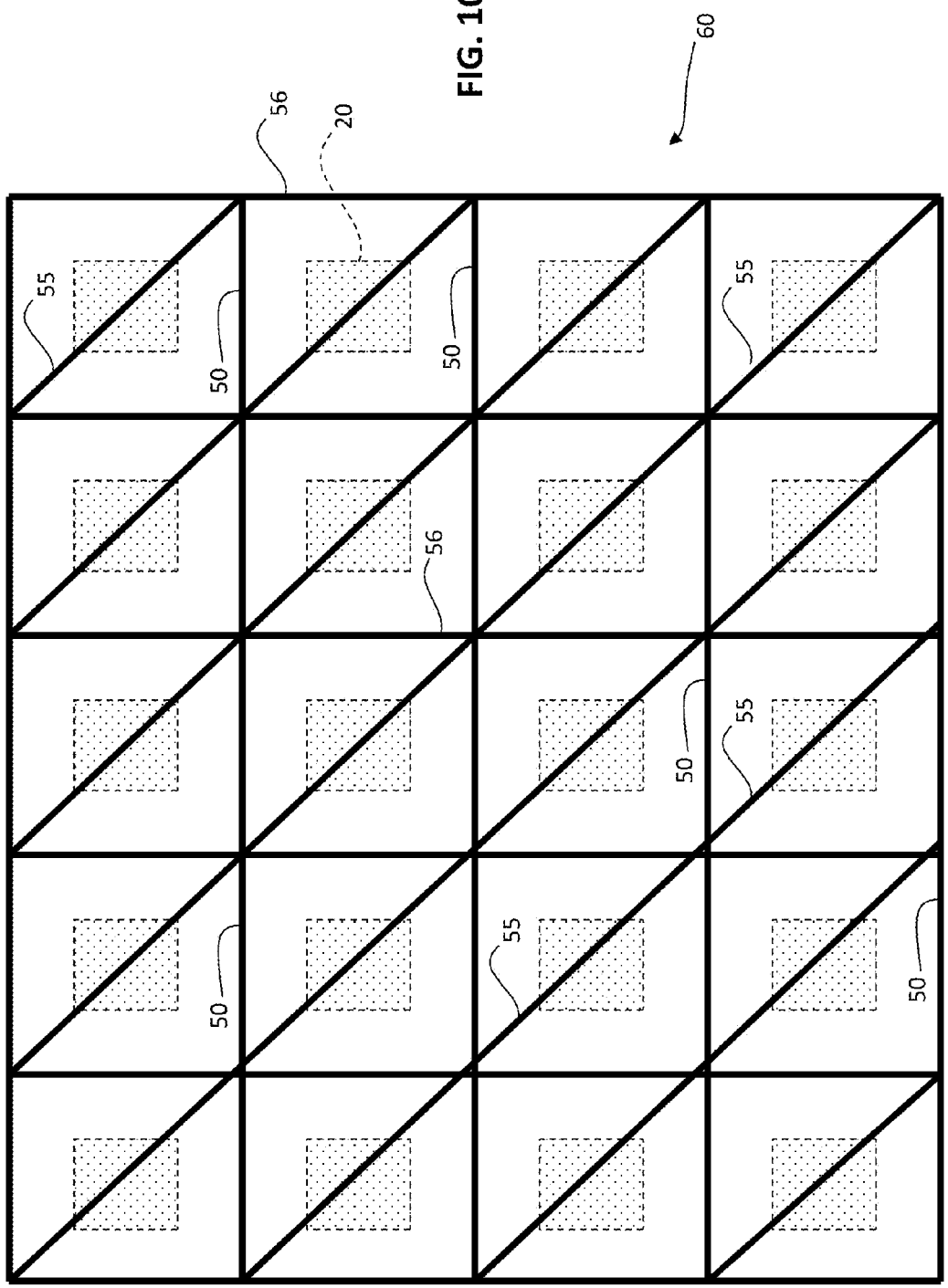

Referring to FIG. 10 in another embodiment of the present invention, pixel micro-wires 55 are located over one or more pixels 20 and electrically connect gap micro-wires 50 and additional gap micro-wires 56 (if present) within electrode 60. Note that in FIG. 10, the designation of gap micro-wires 50 and additional gap micro-wires 56 is arbitrary, as electrode 60 could be either row electrode 64 or column electrode 62. Because pixel micro-wires 55 are located over one or more pixels 20, they can obscure or interfere with light emitted or reflected from pixels 20. To reduce this effect, in other embodiments of the present invention and as shown in FIG. 10, each pixel 20 is equally obscured by pixel micro-wire 55 so that light from every pixel 20 is treated equally to reduce visible differences between pixels 20. Furthermore, in an embodiment illustrated in FIG. 11, gap micro-wires 50 are wider than the pixel micro-wires 55. By increasing the width of gap micro-wires 50, additional conductivity is provided without further obscuring light emitted or reflected from pixels 20.

Figure 11:
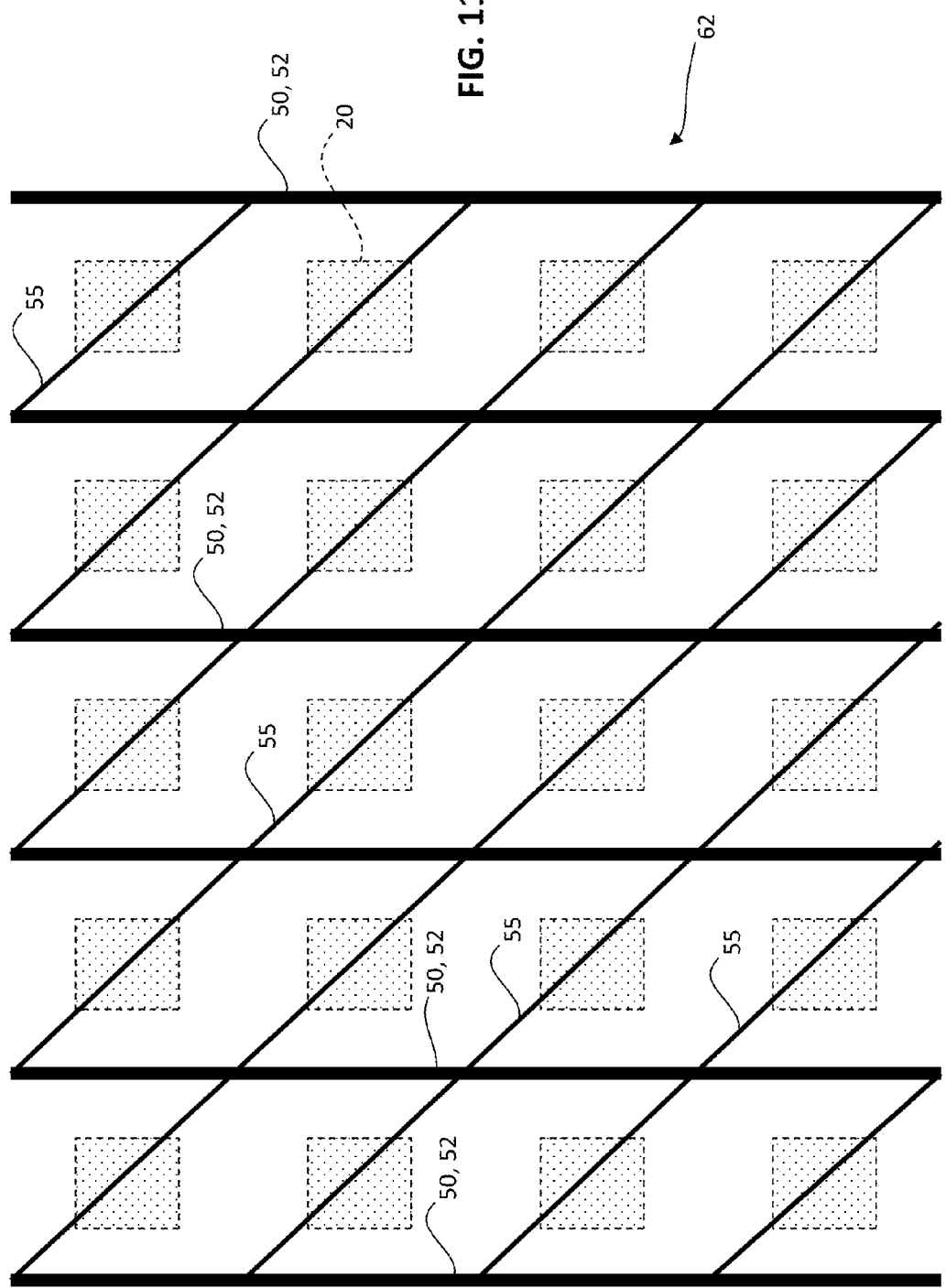

The arrangements of FIGS. 10 and 11 were tested on an IBM 22-inch-diagonal high-resolution LCD, with 3840 by 2240 color pixels. The viewing distance was set at 42 feet to model a hand-held display device viewed at a distance of 8 inches. The pattern was displayed by the IrfanView program. No color banding or moiré was observed and the display appeared neutral. Simulated LCD sub-pixel size was 32 µm by 104 µm, with a pixel spacing of 108 µm in both horizontal and vertical directions and a sub-pixel gap of 4 µm in both directions. The simulated micro-wire size was 5 µm. Emissive area was reduced by 7%.

Figure 12:
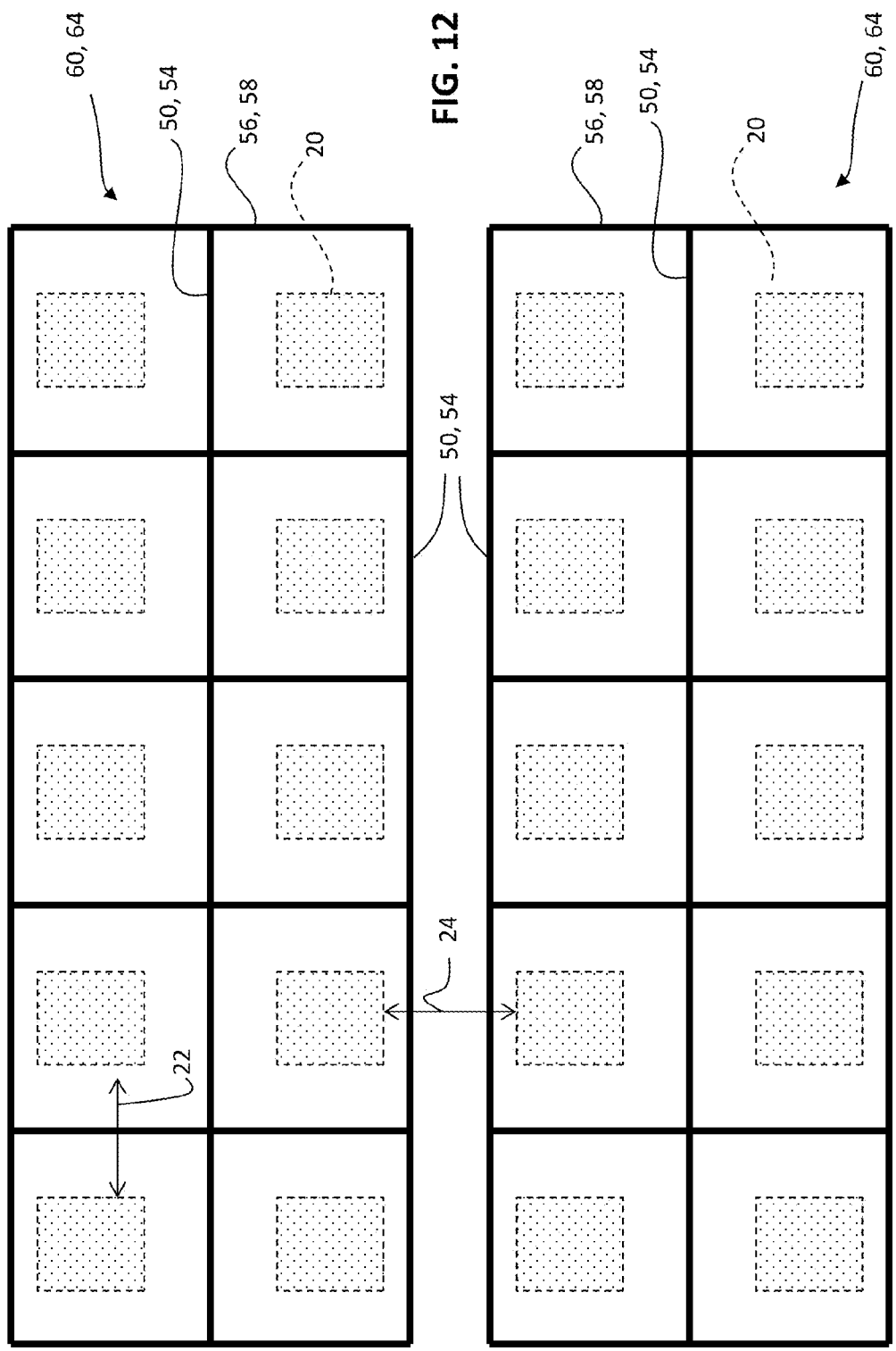

Referring to FIG. 12 (and FIGS. 1 and 2), in an alternative embodiment of the present invention, first and second electrically separate electrodes 60 are formed over display 40. First and second electrodes 60 each have a length and width and extend across at least a portion of the array of pixels, 20. Each electrode 60 includes a plurality of electrically connected micro-wires 50, 56 formed in the micro-pattern. Electrodes 60 of FIG. 12 are illustrated as row electrodes 64 with row micro-wires 54 and additional column micro-wires 58 but the structure of FIG. 12 could be rotated to illustrate column electrodes 62 with column micro-wires 52 and additional row micro-wires 59 (not shown).

FIG. 12 illustrates row electrodes 60 with row micro-wires 54 in row inter-pixel gaps 24 and additional column micro-wires 58 in column inter-pixel gaps 22. Two row micro-wires 54 are located within a single row inter-pixel gap 24. Thus, in an embodiment, first electrode 60 includes gap micro-wire 50 in an inter-pixel gap and second electrode 60 includes gap micro-wire 50 in the same inter-pixel gap. Additional gap micro-wires 56 could be similarly arranged within a common inter-pixel gap in any dimension of the pixel array.

Figure 13:
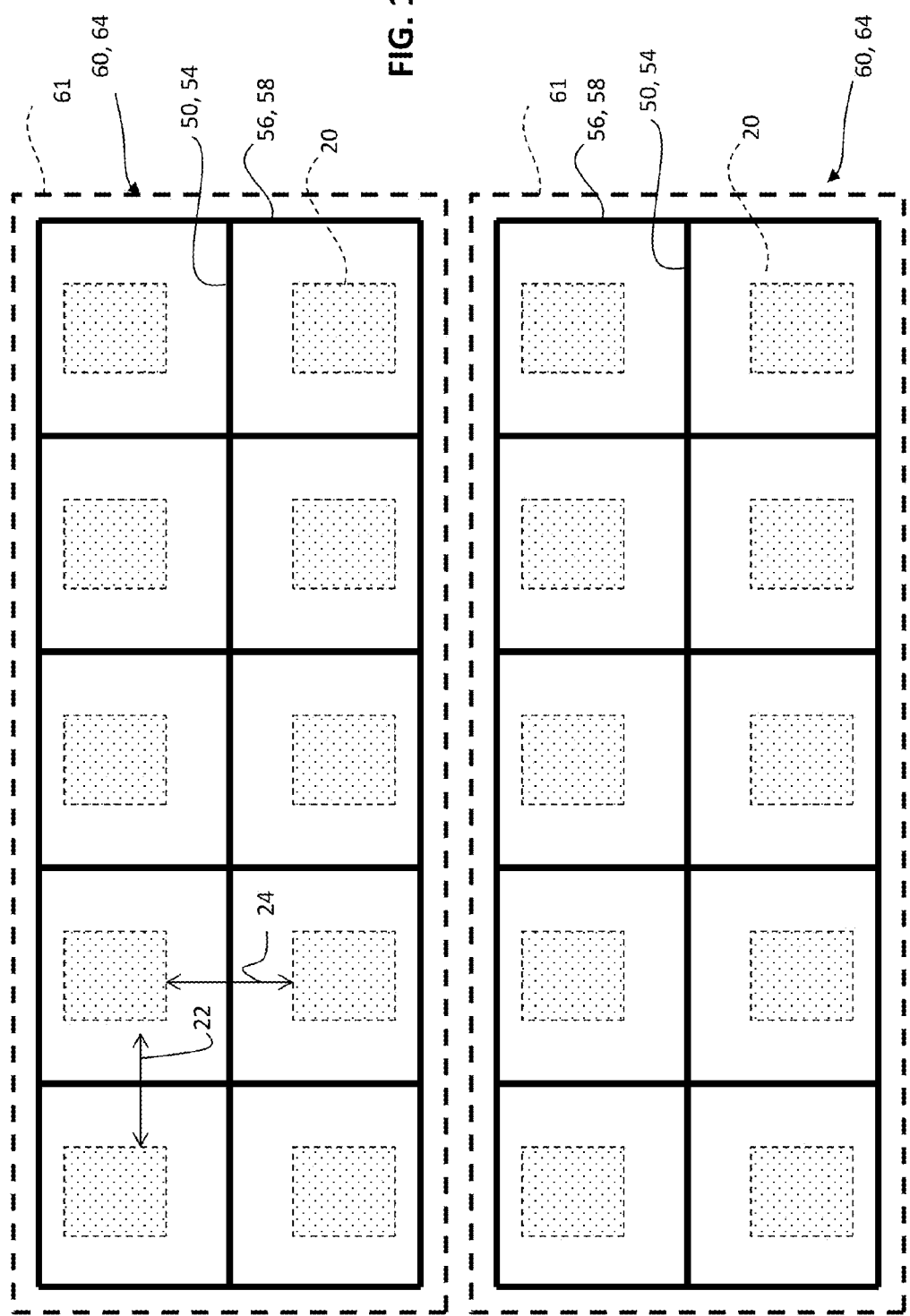

In one embodiment of the present invention, micro-wires (e.g. gap micro-wires 50 or additional gap micro-wires 56) are the only conductive elements in electrode 60. In another embodiment illustrated in FIG. 13, additional conductivity is provided to electrodes 60 by a transparent conductor 61 located over pixels 20 in electrical contact with gap micro-wires 50 and any additional gap micro-wires 56 located in the column and row inter-pixel gaps 22, 24. Transparent conductor 61 could be, for example, a transparent metal oxide conductor (TCO) such as indium tin oxide or aluminum oxide. FIG. 13 illustrates two row electrodes 60 including row micro-wires 54 and additional column micro-wires 58 but could equally be illustrated as a column electrode with column micro-wires 52 and additional row micro-wires 59.

Figure 14:
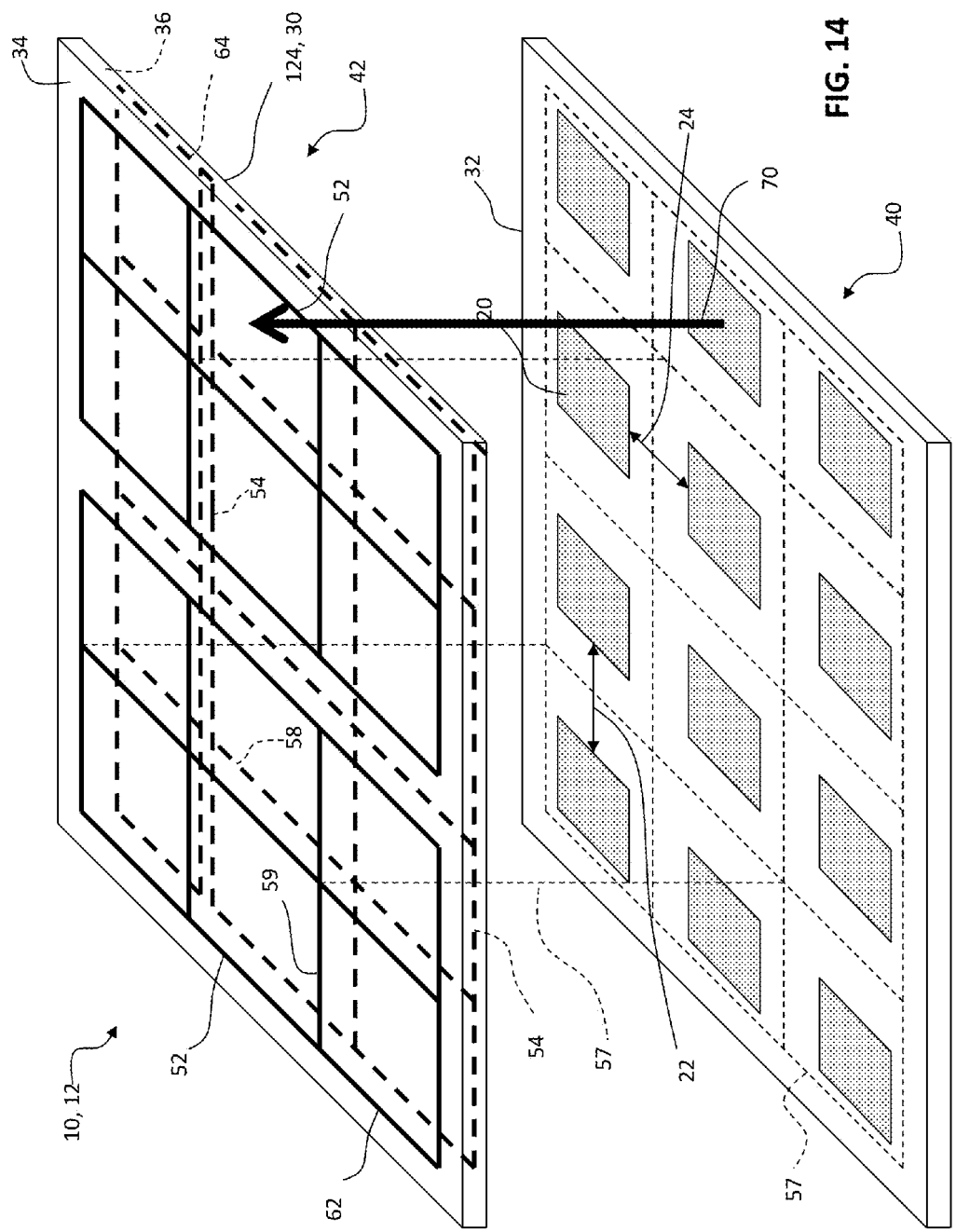
FIG. 14 is an exploded perspective of an embodiment of the present invention.

Referring to FIG. 14, in another embodiment of the present invention, a display apparatus 12 includes display 40 including the array of pixels 20 formed in rows and columns. Pixels 20 in a row are separated by column inter-pixel gaps 22 and pixels 20 within a column are separated by row inter-pixel gaps 24 so that rows of pixels 20 are separated by row inter-pixel gaps 24 and columns of pixels 20 are separated by column inter-pixel gaps 22.

A touch-screen 42 includes substrate 30 such as dielectric layer 124 located over display 40. Touch screen 42 has row electrodes 64 located on a row side 36 of dielectric layer 124 and column electrodes 62 located on a column side 34 of dielectric layer 124 so that row and column electrodes 64, 62 are separated by dielectric layer 124.

Row electrodes 64 include a plurality of electrically connected row micro-wires 54 formed in a row micro-pattern over the array of pixels 20. Row micro-wires 54 are located between pixels 20 in row inter-pixel gaps 24 and substantially extend continuously along the row electrode length. Column electrodes 62 include a plurality of electrically connected column micro-wires 52 formed in a column micro-pattern over the array of pixels 20. Column micro-wires 52 are located between pixels 20 in column inter-pixel gaps 22 and substantially extend continuously along the column electrode length.

Row electrodes 64 can include additional column micro-wires 58 that electrically interconnect row micro-wires 54 in row electrode 64. Additional column micro-wires 58 formed on row side 36 are located in column inter-pixel gaps 22. Similarly, column electrodes 62 can include additional row micro-wires 59 that electrically interconnect column micro-wires 52 in column electrode 62. Additional row micro-wires 59 are located on column side 34 in row inter-pixel gaps 24.

Gap micro-wires 50 and additional micro-wires 56 of column electrodes 62 can coincide with micro-wires 50 and additional micro-wires 56 of row electrodes 64. Alternatively either gap micro-wires 50 or additional micro-wires 56 of row electrode 64 does not coincide with column electrode 62 but is spatially offset.

Figure 15:
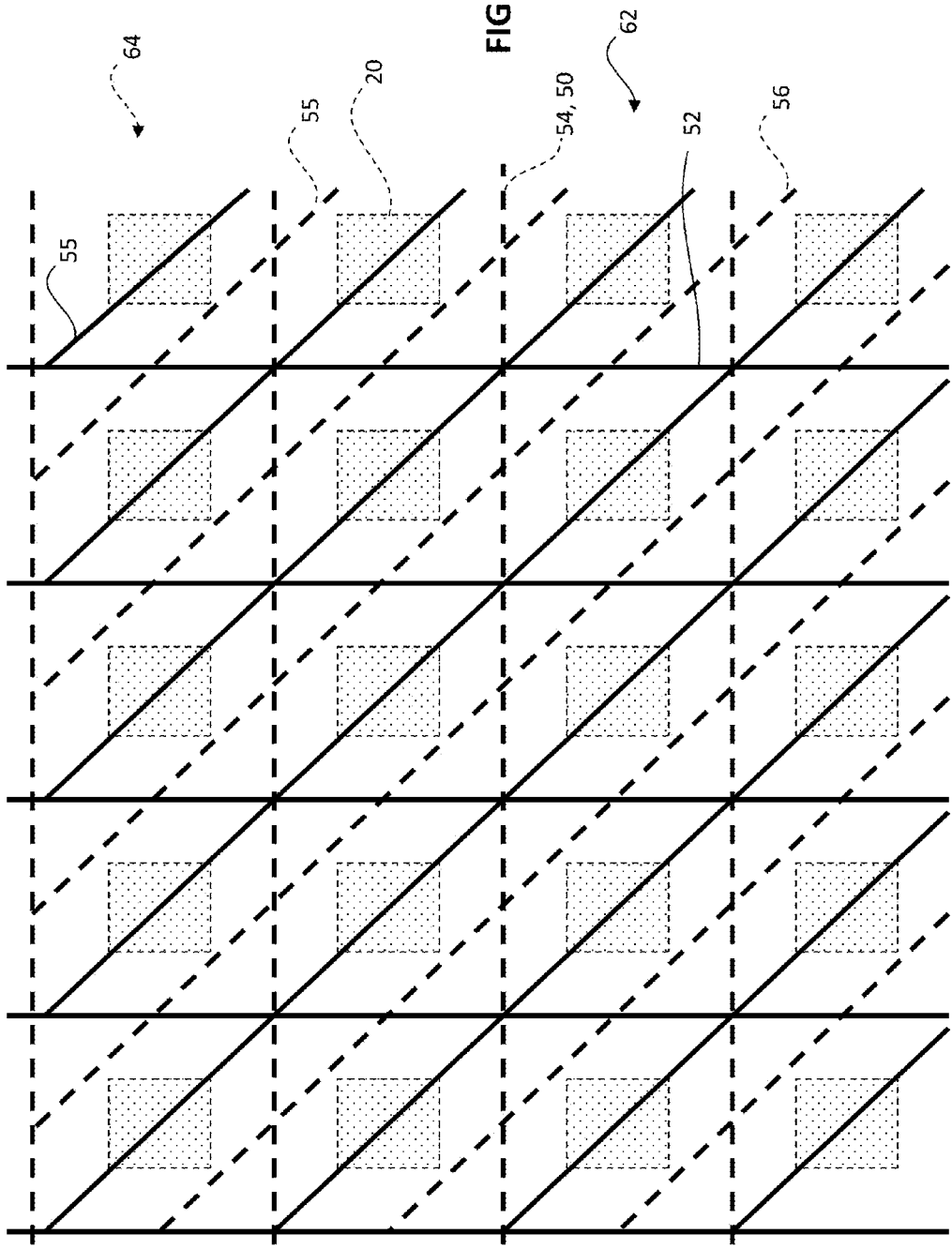
FIG. 15 is a plan view of an electrode illustrating an embodiment of the present invention.

Referring to FIG. 15, in a further embodiment of the present invention, display apparatus 12 can include pixel micro-wires 55 electrically connecting row micro-wires 54 in row electrode 64 and pixel micro-wires 55 electrically connecting column micro-wires 52 in column electrode 62. Row or column micro-wires 54, 52 can be wider than pixel micro-wires 55 (FIG. 11). The column electrode 62 is illustrated in solid lines on one side of a substrate (e.g. a dielectric layer 124, not shown) and the row electrode 64 is illustrated in dashed lines on an opposite side of the substrate (not shown). In either case, pixel micro-wires 55 can be at a non-orthogonal angle to gap micro-wires 50. As shown in FIG. 15, pixel micro-wires 55 of the row electrodes 64 are parallel to pixel micro-wires 55 of the column electrodes 62. The pixel micro-wires 55 of column electrode 64 are also offset with respect to the pixel micro-wires 55 of row electrode 62. This arrangement provides increased capacitance between row and column electrodes 64, 62 when a voltage differential is supplied between row and column electrodes 64, 62. The increased capacitance can improve the signal-to-ratio of a measured capacitance between row and column electrodes 64, 62. In an alternative embodiment (not shown) the pixel micro-wires 55 on different sides of a substrate coincide, are mirror images, reflections, or orthogonal to each other.

Within display device 10 and according to embodiments of the present invention, row micro-wires 54 substantially extend continuously along the row electrode length in a straight line or in a crenellated pattern. Similarly, column micro-wires 52 substantially extend continuously along the column electrode length in a straight line or in a crenellated pattern.

Referring again to the embodiment of FIG. 14, the display 40 has a cover or substrate through which pixel light 70 is emitted or reflected. The cover can be the dielectric layer 124 or substrate 30. Row or column electrodes 64, 62 can be formed on the cover or substrate. In an embodiment, row electrodes 64 are formed on a first side of dielectric layer 124 and column electrodes 62 are formed on a second side of dielectric layer 124 opposite to the first side.

Figure 16:
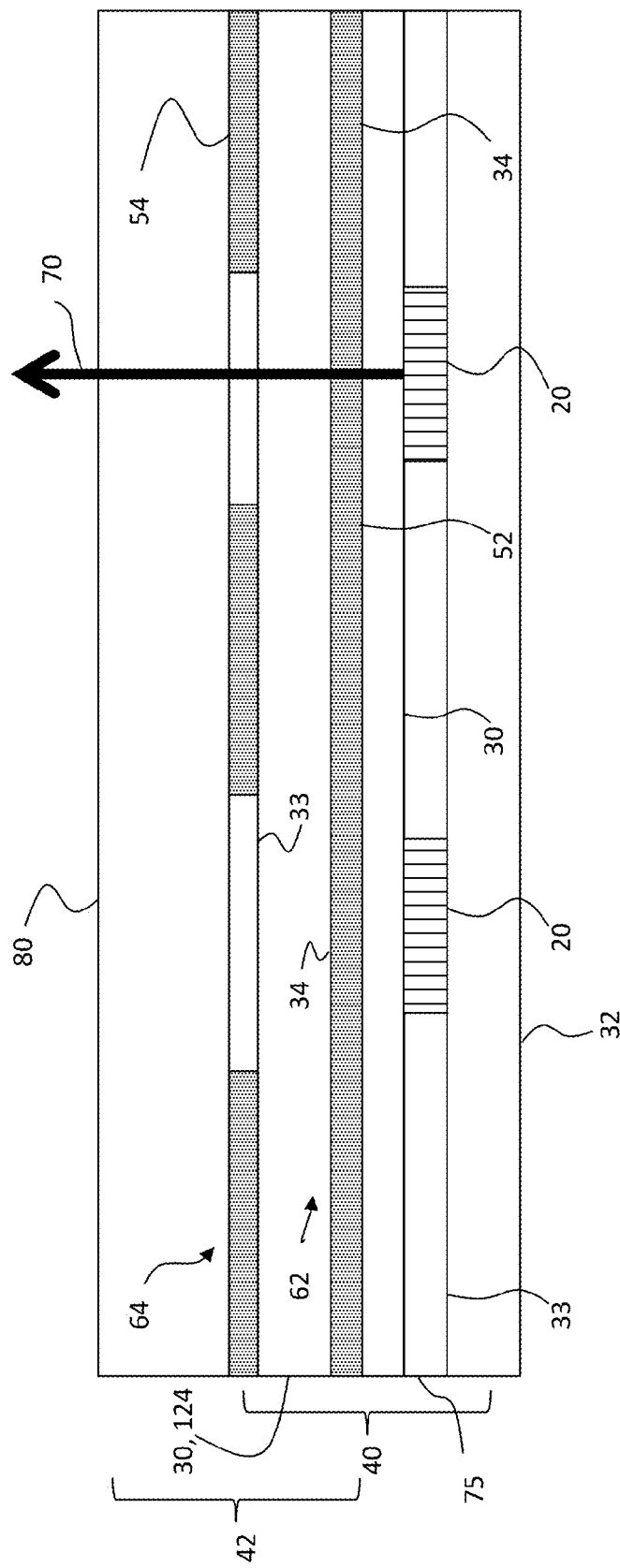
FIGS. 16-17 are cross sections illustrating embodiments of the present invention.

In another embodiment referring to FIG. 16, pixels 20 are formed on a pixel side 33 of display substrate 32 in a light-controlling layer 75. Column electrodes 62 are formed on column side 34 of substrate 30 and located opposite the pixel side 33. Substrate 30 can be a cover for display 40. A dielectric layer 124 is located over the column electrodes 62 and can alternatively serve as a cover for display 40. Row electrodes 64 are formed on dielectric layer 124 opposite the column electrodes 62 so that dielectric layer 124 is located between the column electrodes 62 and the row electrodes 64. A protective layer 80 covers the row electrodes 64. Light 70 is emitted or reflected from the pixels 20 through the column electrodes 62, dielectric layer 124, row electrodes 64, and protective layer 80. The nomenclature for row electrodes 64 and column electrodes 62 can be exchanged. Being formed on, over, or under a substrate side includes being formed on layers formed on a substrate side. Over and under are relative terms that can be exchanged.

Figure 17:
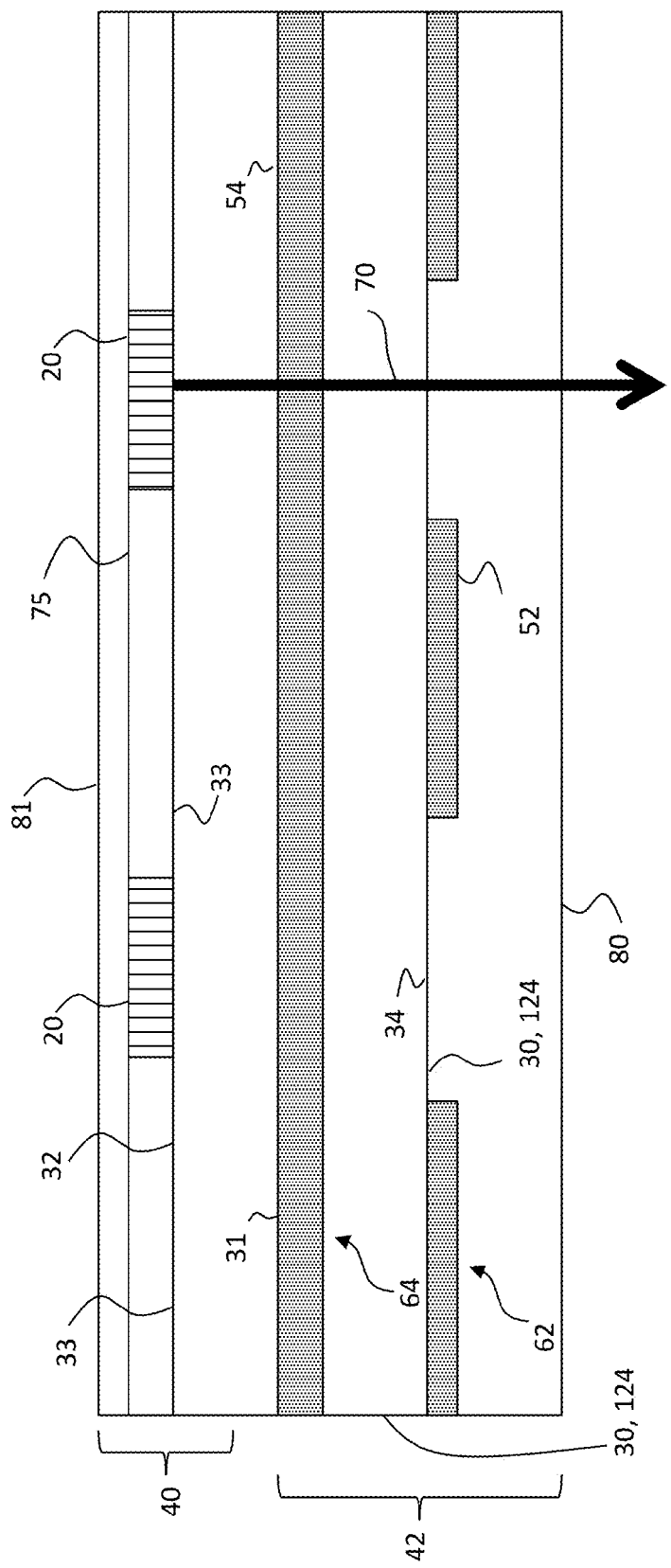

In an alternative embodiment in an inverted structure and referring to FIG. 17, pixels 20 are formed on pixel side 33 of display substrate 32 in light-controlling layer 75 and protected by protective layer 81. Protective layer 81 can be a display cover. Row electrodes 64 are formed on an electrode side 31 of display substrate 32 opposite the pixel side 33. A dielectric layer 124 is located over the row electrodes 64. Column electrodes 62 are formed on a column side 34 of dielectric layer 124 opposite the row electrodes 64 so that dielectric layer 124 is located between the column electrodes 62 and the row electrodes 64. Protective layer 80 covers the column electrodes 62. Light 70 is emitted or reflected from the pixels 20 through the row electrodes 64, dielectric layer 124, column electrodes 62, and protective layer 80. The nomenclature for row electrodes 64 and column electrodes 62 can be exchanged. Being formed on, over, or under a substrate side includes being formed on layers formed on a substrate side. Over and under are relative terms that can be exchanged.

The touch screen 42 can be a capacitive touch screen. In an embodiment, the micro-wires are the only conductive element in the row or column electrodes 64, 62. In this case, only micro-wires operate to form an electrical field when a voltage differential is applied between row electrodes 64 and column electrodes 62. Alternatively, touch screen 42 can include transparent conductors formed over the pixel and electrically connected to gap micro-wires 50.

Figure 20:
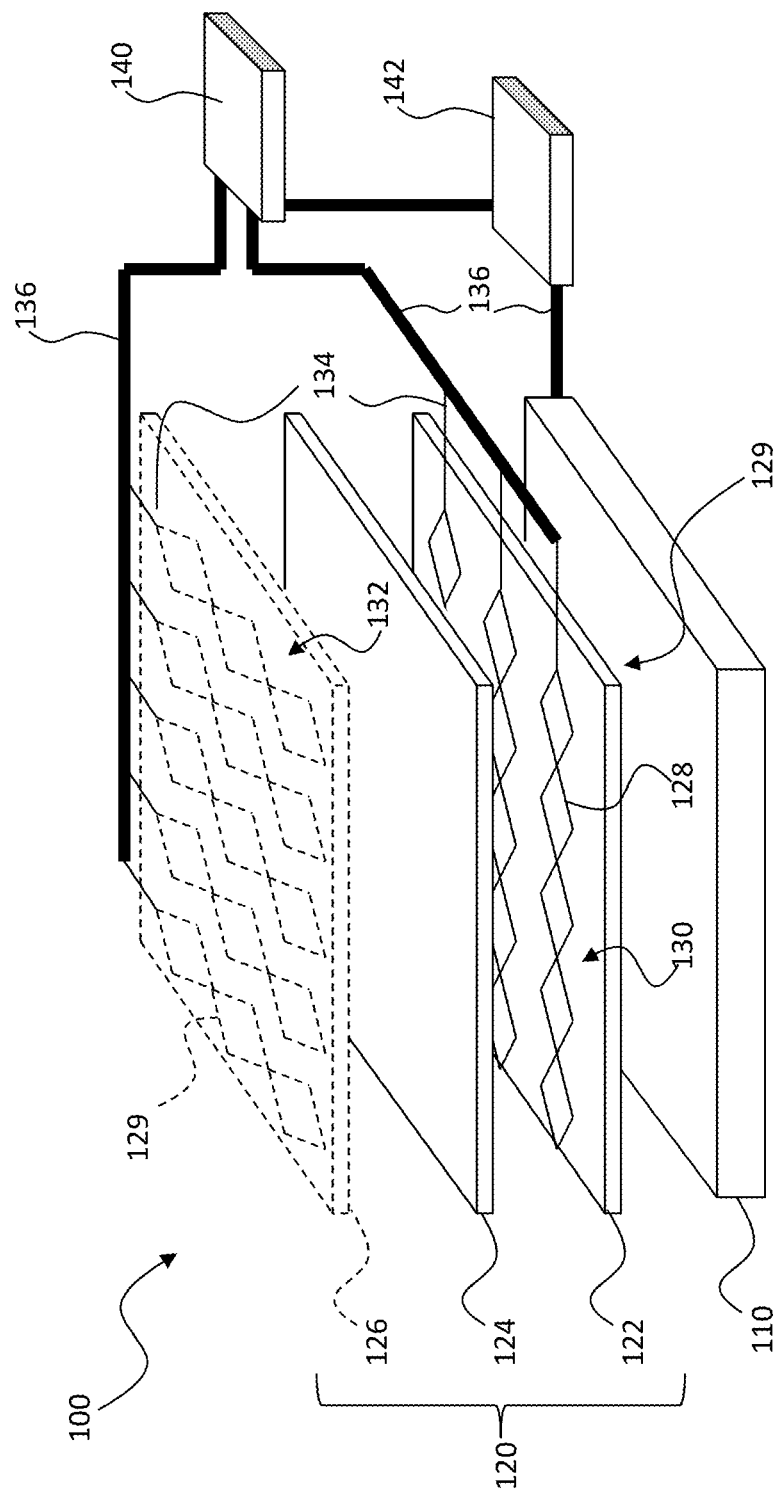
FIG. 20 is an exploded perspective illustrating a prior-art mutual capacitive touch screen having adjacent pad areas in conjunction with a display and controllers.
Figure 21:
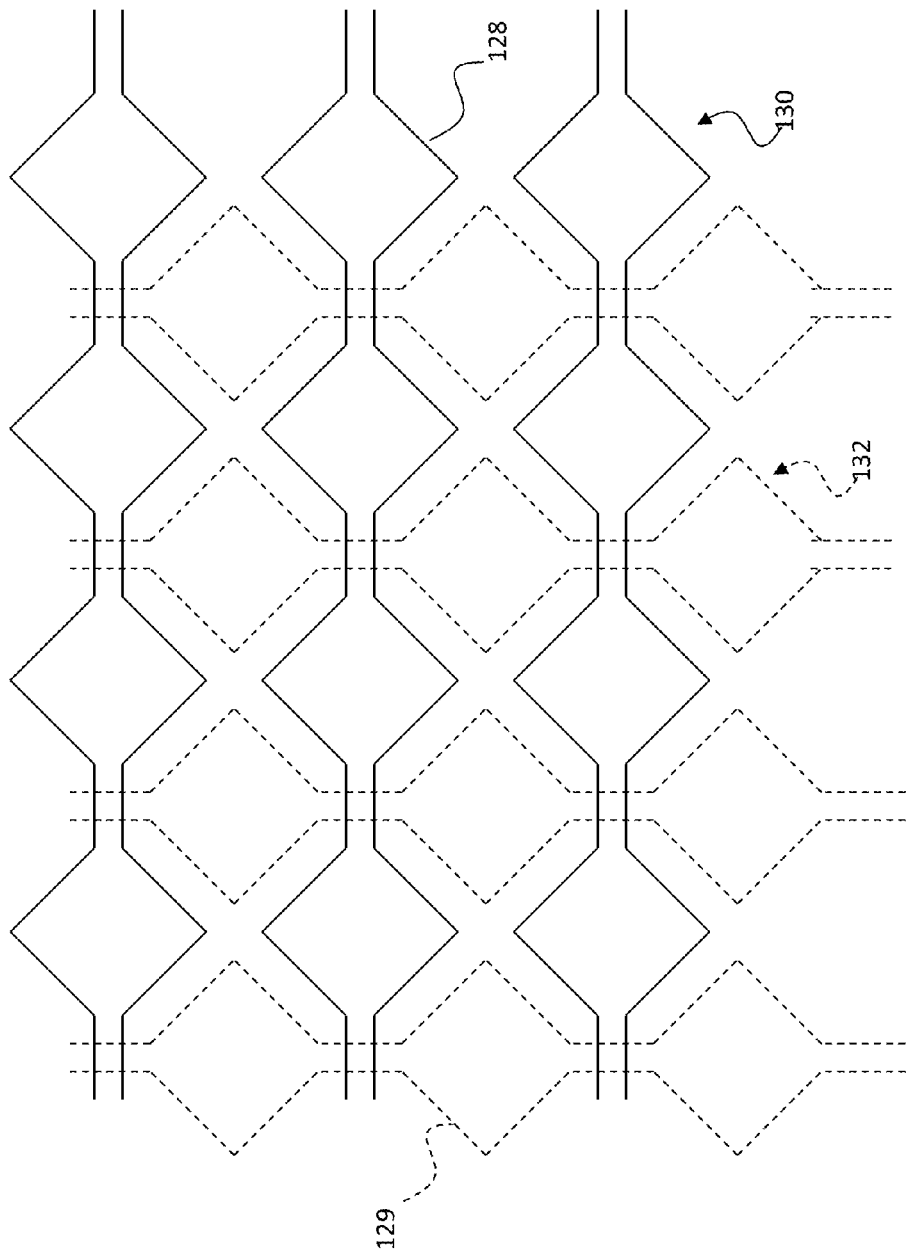
FIG. 21 is a schematic illustrating prior-art adjacent pad areas in a capacitive touch screen.
Figure 22:
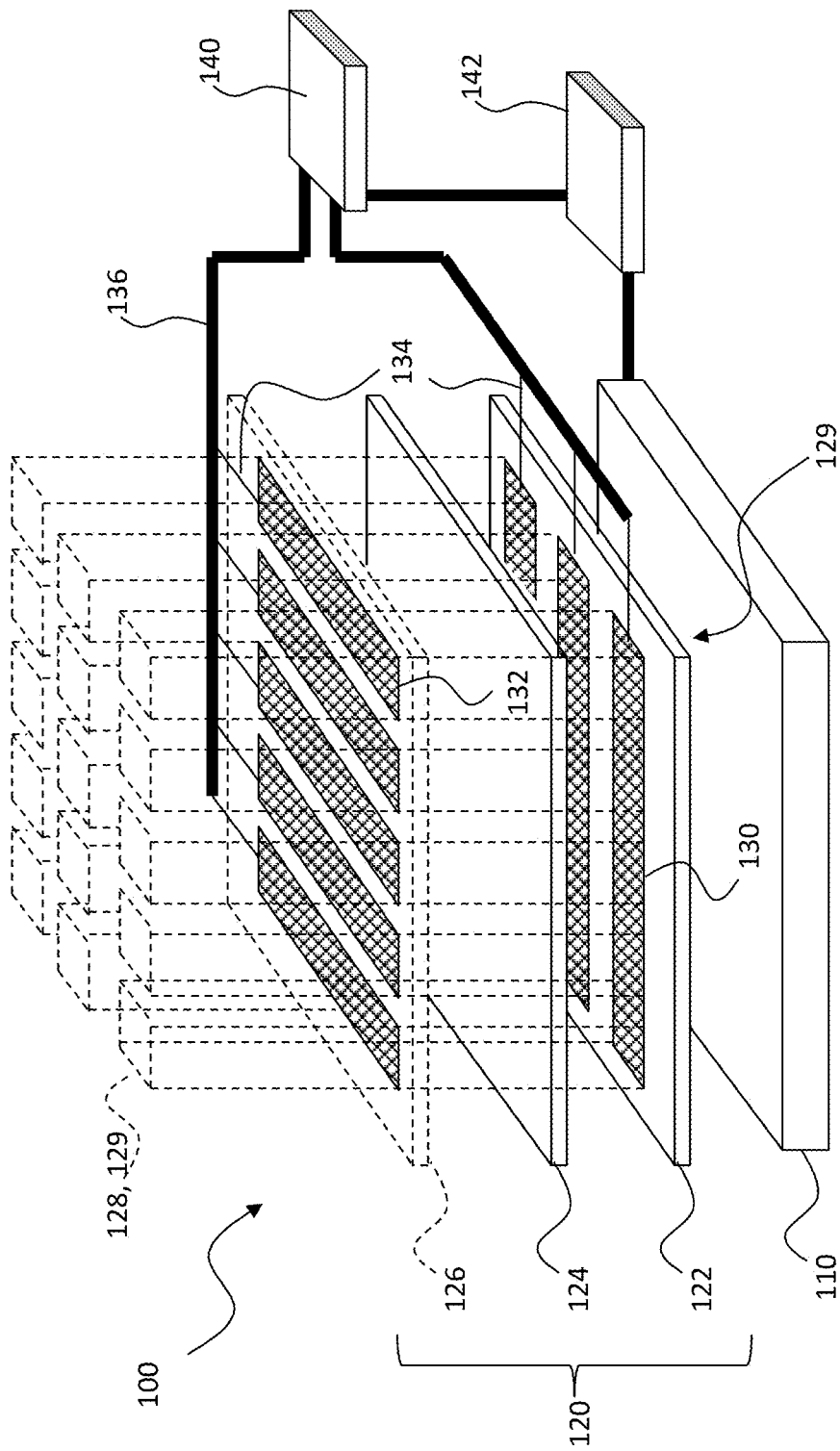
FIG. 22 is an exploded perspective illustrating a prior-art mutual capacitive touch screen having overlapping pad areas in conjunction with a display and controllers.
Figure 23:
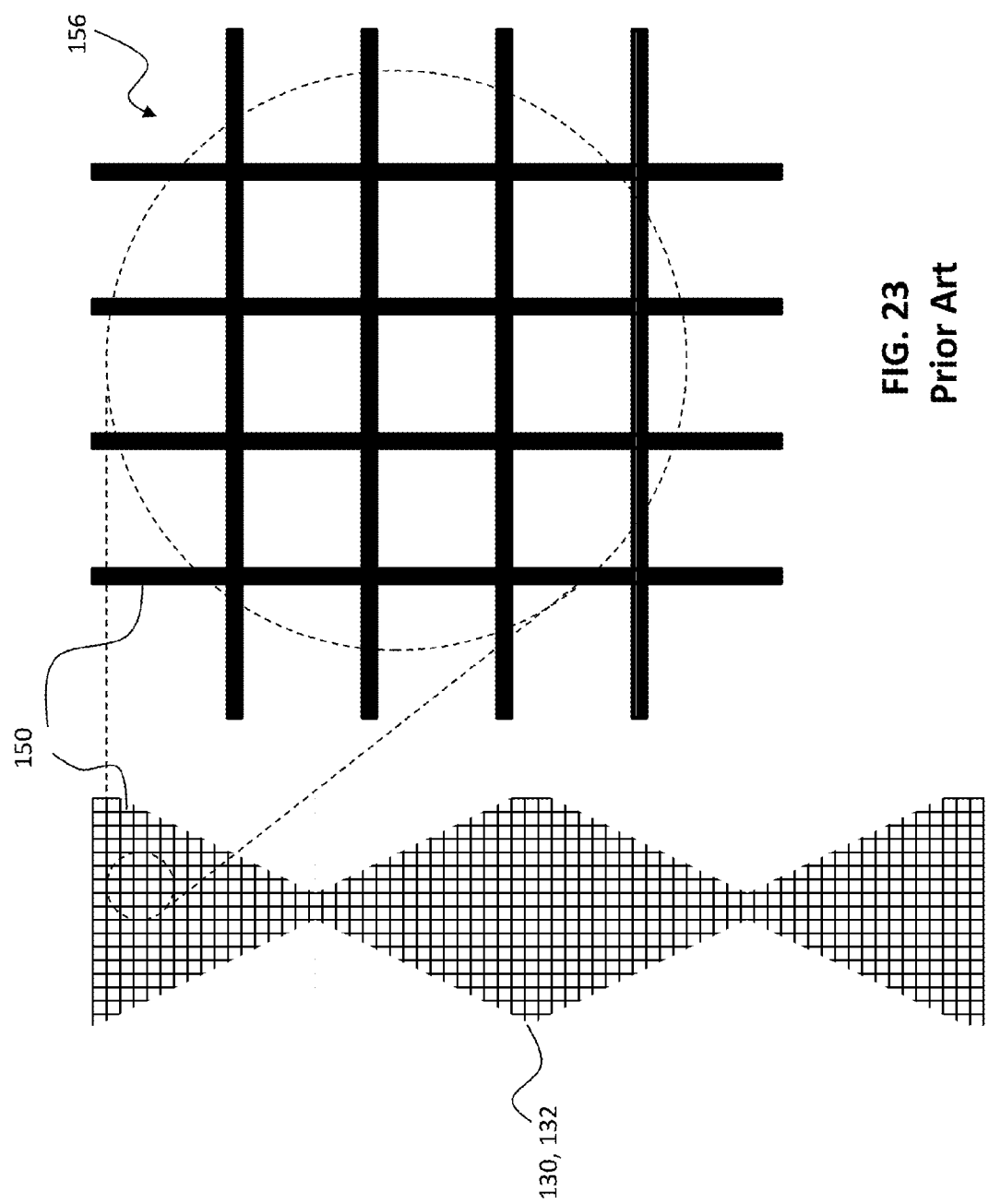
FIG. 23 is a schematic illustrating prior-art micro-wires in an apparently transparent electrode.
Figure 24:
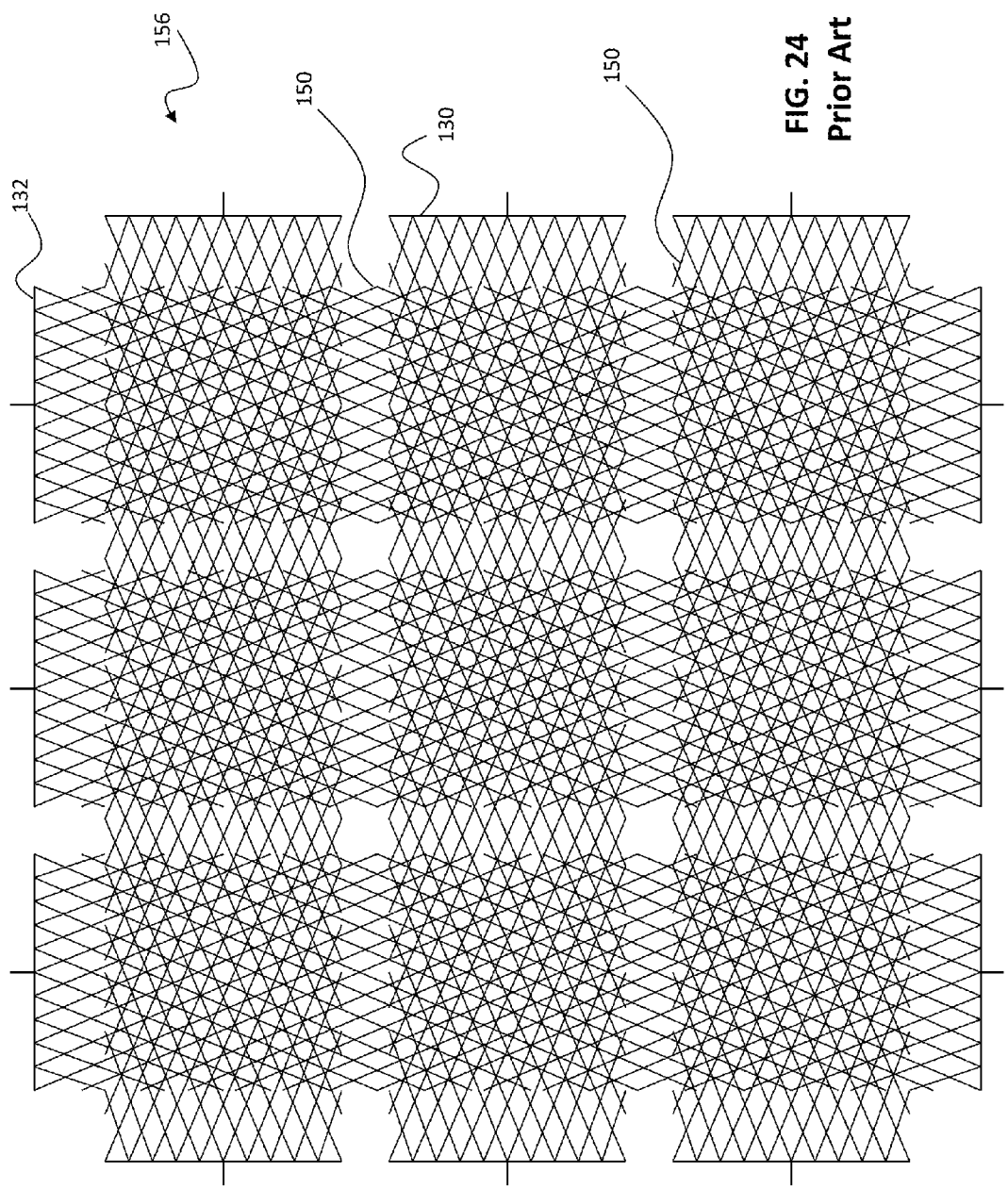
FIG. 24 is a schematic illustrating prior-art micro-wires arranged in two arrays of orthogonal transparent electrodes.

Display device 10 of the present invention can be operated by using display controller 142 (as shown in FIG. 20) to control the display 40 to display information with pixels 20. Touch screen controller 140 (as shown in FIG. 20) provides a voltage differential sequentially to row and column electrodes 64, 62 to scan the capacitance of the capacitor array formed where row and column electrodes 64, 62 overlap. Any change in the capacitance of a capacitor in the array can indicate a touch at the location of the capacitor in the array. The location of the touch can be related to information presented on one or more pixels 20 at the corresponding pixel location to indicate an action or interest in the information present at the corresponding pixel location.

According to further embodiments of the present invention (FIG. 18), a method of making display device 10 includes providing 200 a first transparent substrate 122 having an array of pixels 20 located in correspondence thereto, pixels 20 separated by column or row inter-pixel gaps 22, 24 in at least one dimension. A first transparent electrode 130 is formed 205 having a length and width located over the first transparent substrate 122 and extending across at least a portion of the array of pixels 20, first transparent electrode 130 including a plurality of electrically connected micro-wires formed in a first micro-pattern. The first micro-pattern includes gap micro-wires 50 located between pixels 20 in the column or row inter-pixel gaps 22, 24 and substantially extending continuously along the first transparent electrode 130 length.

Display 40 is formed 210 or provided on a side of first transparent substrate 122 opposite first transparent electrode 130. A dielectric layer 124 is formed 220 over first transparent electrode 130 or on one or more layers on first transparent electrode 130 and a second transparent electrode 132 is provided 225 over dielectric layer 124. Protective layer 80 or cover is provided 230 or formed over second transparent electrode 132 or on one or more layers on second transparent electrode 132. In various embodiments, dielectric layer 124 or protective layer 80 is coated or provided and located or assembled with first or second transparent electrodes 130, 132.

First transparent substrate 122 can have a substantially planar pixel side 33 on which pixels 20 are correspondingly located and a substantially planar electrode side 31 opposed to pixel side 33. The pixel and electrode sides 33, 31 can be substantially parallel. Pixels 20 are formed on pixel side 33 or on one or more layers on pixel side 33. In various embodiments, first transparent electrode 130 is formed on electrode side 31 or on one or more layers on electrode side 31 before or after display 40 is formed on pixel side 33 of first transparent substrate 122.

Second transparent electrode 132 has a second length and second width and extends across at least a portion of the array of pixels 20 and includes a plurality of electrically connected micro-wires formed in a second micro-pattern. The second micro-pattern includes gap micro-wires 50 located between pixels 20 in the column or row inter-pixel gaps 22, 24 and substantially extending continuously along the second electrode length.

Figure 19:
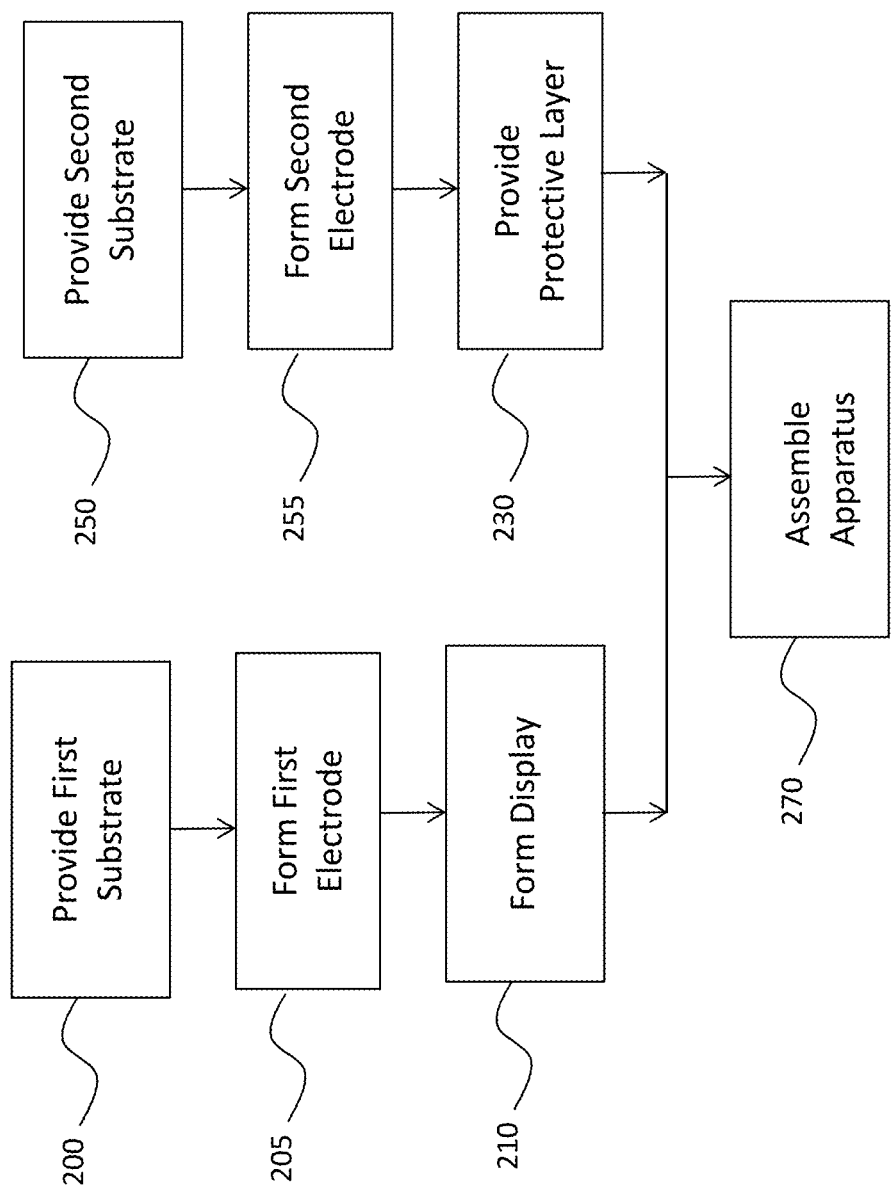

Referring to FIG. 19 in an alternative method of the present invention, a second transparent substrate 126 having a substantially planar first side and a substantially planar second side opposed to the first side is provided 250 and located in correspondence to the array of pixels 20. Second transparent electrode 132 is formed 255 on the first side or on one or more layers on the first side, second transparent electrode 132 having a second length and second width and extending across at least a portion of the array of pixels 20. The second electrode includes a plurality of electrically connected micro-wires formed in a second micro-pattern that includes gap micro-wires 50 located between pixels 20 in column or row inter-pixel gaps 22, 24 and substantially extends continuously along second transparent electrode 132 length. Protective layer 80 is provided 230 and the device assembled 270.

Figure 18:
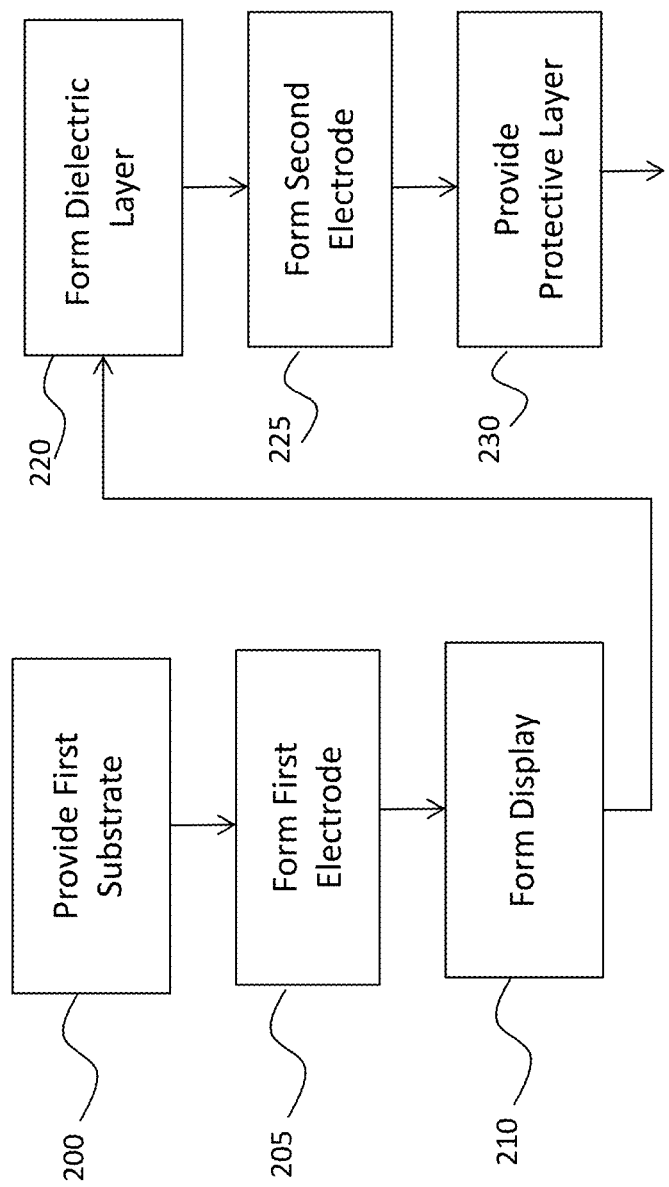
FIGS. 18-19 are flow diagrams illustrating embodiments of the present invention.

First transparent substrate 122 is provided 200, first transparent electrode 130 formed 205, and the display formed 210 as described with respect to FIG. 18 above.

By locating substrates or layers in correspondence is meant that either the layers or substrates are physically aligned or that information describing the layers (e.g. pixels) is used to design and make a layer (e.g. electrodes) in alignment and the layers or substrates are subsequently assembled in alignment.

In an embodiment, second transparent substrate 126 is provided or formed as dielectric layer 124 and is located between second transparent electrode 132 and first transparent electrode 130. In a further embodiment, second transparent electrode 132 is located between dielectric layer 124 and second transparent substrate 126.

In an embodiment, the pixels are formed on display substrate 32 or on one or more layers on display substrate 32 and are located between display substrate 32 and first transparent substrate 122. Further, in an embodiment first transparent electrode 130 is formed on pixel side 33 or on one or more layers on pixel side 33.

In an embodiment, first transparent substrate 122 has a substantially planar pixel side 33 on which pixels 20 are located in correspondence thereto and a substantially planar electrode side 31 opposed to pixel side 33, and first transparent electrode 130 is formed on pixel side 33 or on one or more layers on pixel side 33. Second transparent electrode 132 is formed on electrode side 31, second transparent electrode 132 having a second length and second width and extending across at least a portion of the array of pixels 20, and including a plurality of electrically connected micro-wires formed in a second micro-pattern. The second micro-pattern includes gap micro-wires 50 located between pixels 20 in column or row inter-pixel gaps 22, 24 and substantially extends continuously along the second transparent electrode 132 length.

In further embodiments, protective layer 80 is formed or provided on or over second transparent electrode 132 or on one or more layers on or over second transparent electrode 132 or providing a protective substrate on or over second transparent electrode 132.

In an embodiment, the first electrode is formed on electrode side 31 and dielectric layer 124 formed on first transparent electrode 130 or on one or more layers on first transparent electrode 130. A second transparent electrode 132 is formed on dielectric layer 124 or on one or more layers on dielectric layer 124, second transparent electrode 132 having a second length and second width and extending across at least a portion of the array of pixels 20, second transparent electrode 132 including a plurality of electrically connected micro-wires formed in a second micro-pattern. The second micro-pattern includes gap micro-wires 50 located between pixels 20 in the column or row inter-pixel gaps 22, 24 and substantially extends continuously along second transparent electrode 132 length. Protective layer 80 can be formed or provided on second transparent electrode 132 or on one or more layers on second transparent electrode 132, or a protective substrate provided on or over second transparent electrode 132.

In an embodiment, substrate 30 is provided as the display cover or display substrate 32.

Substrates of the present invention can include any material capable of providing a supporting surface on which micro-wires or display elements can be formed and patterned. Substrates such as glass, metal, or plastics can be used and are known in the art together with methods for providing suitable surfaces. In a useful embodiment, substrates are substantially transparent, for example having a transparency of greater than 90%, 80% 70% or 50% in the visible range of electromagnetic radiation.

Various substrates of the present invention can be similar substrates, for example made of similar materials and having similar material deposited and patterned thereon. Likewise, electrodes of the present invention can be similar, for example made of similar materials using similar processes.

Electrodes of the present invention can be formed directly on substrates or over substrates on layers formed on substrates. The words "on", "over', or the phrase "on or over" indicate that the micro-wires of the electrodes of the present invention can be formed directly on a substrate, on layers formed on a substrate, or on other layers or another substrate located so that the electrodes are over the desired substrate. Likewise, electrodes can be formed under or beneath substrates. The words "on", "under", "beneath" or the phrase "on or under" indicate that the micro-wires of the electrodes of the present invention can be formed directly on a substrate, on layers formed on a substrate, or on other layers or another substrate located so that the electrodes are under the desired substrate. "Over" or "under", as used in the present disclosure, are simply relative terms for layers located on or adjacent to opposing surfaces of a substrate. By flipping the substrate and related structures over, layers that are over the substrate become under the substrate and layers that are under the substrate become over the substrate. The descriptive use of "over" or "under" do not limit the structures of the present invention.

The length direction of an electrode is typically the direction of the greatest spatial extent of an electrode over the substrate on which the electrode is formed. Electrodes formed on or over substrates are typically rectangular in shape, or formed of rectangular elements, with a length and a width, and the length is much greater than the width. Electrodes are generally used to conduct electricity from a first point on a substrate to a second point and the direction of the electrode from the first point to the second point can be the length direction.

In an embodiment of the present invention, electrodes are variable in width, where the length is the extent of an electrode in the length direction over a substrate and the width is in a direction orthogonal to the length. The width variations can be spatially aligned so that, for example one electrode has its narrowest point where an adjacent electrode has its widest point or so that one electrode has its narrowest point where an adjacent electrode has its narrowest point.

Display device 10 of the present invention can be used in a display apparatus 12 including display 40 and capacitive touch screen 42, as illustrated in the perspective of FIG. 14. Wires 134, buss connections 136, touch-screen controller 140, and display controller 142 of FIG. 20 can be used to control and operate the display device 10 of the present invention, as discussed above with respect to FIG. 14. In response to a voltage differential provided by display controller 142 (FIG. 20) between electrodes 60 on either side of dielectric layer 124, an electrical field is formed and a capacitance produced. Touch-screen controller 140 (FIG. 20) sequentially energizes electrodes 60 and senses a capacitance. The capacitance of overlapping electrode areas is changed in the presence of a conductive element, such as a finger. The change in capacitance is detected and indicates a touch. By providing electrode 60 in display device 10 as disclosed above, one or all of the conductivity, sensitivity, signal-to-noise ratio, and sensing rate of touch screen 42 can be improved. Alternatively or in addition, the transparency and hence the appearance of touch screen 42 can be improved.

As used herein, micro-wires in each electrode 60 are micro-wires formed in a micro-wire layer that forms a conductive mesh of electrically connected micro-wires. If first and second transparent substrate 122, 126 on which micro-wires are formed is planar, for example, a rigid planar substrate such as a glass substrate, the micro-wires in a micro-wire layer are formed in, or on, a common plane as a conductive, electrically connected mesh. If first or second transparent substrate 122, 126 is flexible and curved, for example a plastic substrate, the micro-wires in a micro-wire layer are a conductive, electrically connected mesh that is a common distance from a surface of the flexible, first or second transparent substrate 122, 126.

The micro-wires can be formed on first or second transparent substrate 122,126 or on a layer above (or beneath) first or second transparent substrate 122, 126. The micro-wires for each of electrodes 60 can be formed on opposing sides of the same first or second transparent substrate 122, 126 or on facing sides of separate first or second transparent substrates 122, 126 or some combination of those arrangements. For example, two substrates can be used on which electrodes 60 of the present invention are formed where one of the substrates serves as dielectric layer 124 and electrode 60 of the other substrate faces dielectric layer 124 on a side of dielectric layer 124 opposite the electrode of dielectric layer 124.

In an example and non-limiting embodiment of the present invention, each micro-wire is 5 microns wide and separated from neighboring micro-wires in an electrode by a distance of 50 microns, so that the transparent electrode is 90% transparent. As used herein, transparent refers to elements that transmit at least 50% of incident visible light, preferably 80% or at least 90%. The micro-wires can be arranged in a micro-pattern that is unrelated to the pattern of the electrodes. Micro-patterns other than those illustrated in the Figures can be used in other embodiments and the present invention is not limited by the pattern of the electrodes.

Coating methods for making dielectric layers or protective layers are known in the art and can use, for example, spin or slot coating or extrusion of plastic materials on a substrate, or sputtering. Suitable materials are also well known. The formation of patterned electrical wires on a substrate are also known, as are methods of making displays, such as OLED or liquid crystal, on a substrate and providing and assembling covers with the substrate.

Micro-wires can be metal, for example silver, gold, aluminum, nickel, tungsten, titanium, tin, or copper or various metal alloys including, for example silver, gold, aluminum, nickel, tungsten, titanium, tin, or copper. Other conductive metals or materials can be used. Micro-wires can be made of a thin metal layer. Micro-wires can be, but need not be, opaque. Alternatively, the first or second micro-wires can include cured or sintered metal particles such as nickel, tungsten, silver, gold, titanium, or tin or alloys such as nickel, tungsten, silver, gold, titanium, or tin. Conductive inks can be used to form micro-wires with pattern-wise deposition and curing steps. Other materials or methods for forming micro-wires can be employed and are included in the present invention.

Micro-wires can be formed by patterned deposition of conductive materials or of patterned precursor materials that are subsequently processed, if necessary, to form a conductive material. Suitable methods and materials are known in the art, for example inkjet deposition or screen printing with conductive inks. Alternatively, micro-wires can be formed by providing a blanket deposition of a conductive or precursor material and patterning and curing, if necessary, the deposited material to form a micro-pattern of micro-wires. Photo-lithographic and photographic methods are known to perform such processing. The present invention is not limited by the micro-wire materials or by methods of forming a pattern of micro-wires on a supporting substrate surface. Commonly-assigned U.S. Ser. No. 13/406,649 filed Feb. 28, 2012, the disclosure of which is incorporated herein, discloses a variety of materials and methods for forming patterned micro-wires on a substrate surface.

In embodiments of the present invention, the micro-wires are made by depositing an unpatterned layer of material and then differentially exposing the layer to form the different micro-wire micro-patterns. For example, a layer of curable precursor material is coated over the substrate and pattern-wise exposed. The first and second micro-patterns are exposed in a common step or in different steps. A variety of processing methods can be used, for example photo-lithographic or silver halide methods. The materials can be differentially pattern-wise exposed and then processed.

A variety of materials can be employed to form the patterned micro-wires, including resins that can be cured by cross-linking wave-length-sensitive polymeric binders and silver halide materials that are exposed to light. Processing can include both washing out residual uncured materials and curing or exposure steps.

In an embodiment, a precursor layer includes conductive ink, conductive particles, or metal ink. The exposed portions of the precursor layer can be cured to form the micro-wires (for example by exposure to patterned laser light to cross-link a curable resin) and the uncured portions removed. Alternatively, unexposed portions of the first and second micro-wire layers can be cured to form the micro-wires and the cured portions removed.

In another embodiment of the present invention, the precursor layers are silver salt layers. The silver salt can be any material that is capable of providing a latent image (that is, a germ or nucleus of metal in each exposed grain of metal salt) according to a desired pattern upon photo-exposure. The latent image can then be developed into a metal image. For example, the silver salt can be a photosensitive silver salt such as a silver halide or mixture of silver halides. The silver halide can be, for example, silver chloride, silver bromide, silver chlorobromide, or silver bromoiodide.

According to some embodiments, the useful silver salt is a silver halide (AgX) that is sensitized to any suitable wavelength of exposing radiation. Organic sensitizing dyes can be used to sensitize the silver salt to visible or IR radiation, but it can be advantageous to sensitize the silver salt in the UV portion of the electromagnetic spectrum without using sensitizing dyes.

Processing of AgX materials to form conductive traces typically involves at least developing exposed AgX and fixing (removing) unexposed AgX. Other steps can be employed to enhance conductivity, such as thermal treatments, electroless plating, physical development and various conductivity enhancing baths, as described in U.S. Pat. No. 3,223,525.

To achieve transparency, the total area occupied by the first micro-wires can be less than 15% of the first transparent conductor area and the total area occupied by the second micro-wires can be less than 15% of the second transparent conductor area. The transparent conductive structure can include a plurality of first and second transparent conductor areas.

In an embodiment, the first and second precursor material layers can each include a metallic particulate material or a metallic precursor material, and a photosensitive binder material.

In any of these cases, the precursor material is conductive after it is cured and any needed processing completed. Before patterning or before curing, the precursor material is not necessarily electrically conductive. As used herein, precursor material is material that is electrically conductive after any final processing is completed and the precursor material is not necessarily conductive at any other point in the micro-wire formation process.

Methods and devices for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

Although the present invention has been described with emphasis on capacitive touch screen embodiments, the anisotropically conductive transparent electrodes are useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

Parts List

L electrode length
W electrode width
10 display device
12 display apparatus
20 pixel
21 pixel group
22 column inter-pixel gap
24 row inter-pixel gap
30 substrate
31 electrode side
32 display substrate
33 pixel side
34 column side
36 row side
40 display
42 touch screen
50 gap micro-wire
52 column micro-wire
54 row micro-wire
55 pixel micro-wire
56 additional gap micro-wire
57 micro-pattern projection
58 additional column micro-wire
59 additional row micro-wire
60 electrode
61 transparent conductor
62 column electrode
64 row electrode
70 light
75 light-controlling layer
80 protective layer
81 protective layer
100 touch screen and display apparatus
110 display
120 touch screen
122 first transparent substrate
124 transparent dielectric layer
126 second transparent substrate
128 first pad area
129 second pad area
130 first transparent electrode
132 second transparent electrode
134 wires
136 buss connections
140 touch-screen controller
142 display controller
150 micro-wire
156 micro-pattern
200 provide transparent substrate step
205 form first electrodes step
210 form display step
220 form dielectric layer step
225 form second electrode step
230 provide protective layer step
250 form second substrate step
255 form second electrode step
270 assemble device step

The invention claimed is:

1. A display apparatus, comprising:
a display including an array of pixels formed in rows and columns, the pixels in a row separated by column inter-pixel gaps and the pixels in a column separated by row inter-pixel gaps;
a capacitive touch-screen including a dielectric layer located over the display, the touch screen having row electrodes located on a row side of the dielectric layer and column electrodes located on a column side of the dielectric layer, the row and column electrodes separated by the dielectric layer;
wherein the row electrodes include a plurality of electrically connected row micro-wires formed in a row micro-pattern over the array of pixels, the row micro-wires located between the pixels in the row inter-pixel gaps and substantially extending continuously along the row electrode length;
wherein the row electrodes each include a first micro-wire located in a first inter-pixel gap and a second micro-wire different from the first micro-wire located in a second inter-pixel gap different from the first inter-pixel gap;
wherein the column electrodes include a plurality of electrically connected column micro-wires formed in a column micro-pattern over the array of pixels, the column micro-wires located between the pixels in the column inter-pixel gaps and substantially extending continuously along the column electrode length;
wherein the column electrodes each include a first micro-wire located in a first inter-pixel gap and a second micro-wire different from the first micro-wire located in a second inter-pixel gap different from the first inter-pixel gap;
wherein the row and column electrodes form an array of capacitors;
wherein the row micro-pattern includes additional row micro-wires located between the pixels in the inter-pixel gaps electrically connecting the row micro-wires and the column micro-pattern includes additional column micro-wires located between the pixels in the inter-pixel gaps electrically connecting the column micro-wires; and
wherein the pixels are grouped and the row micro-wires and additional row micro-wires are located between the groups of pixels in the inter-pixel gaps but not between pixels within a group or wherein the pixels are grouped and the column micro-wires and additional column micro-wires are located between the groups of pixels in the inter-pixel gaps but not between pixels within a group.

2. The display apparatus of claim 1, wherein the row electrodes further include additional column micro-wires that electrically interconnect row micro-wires in a row electrode.

3. The display apparatus of claim 2, wherein the additional column micro-wires located on the row side are located in the column inter-pixel gaps.

4. The display apparatus of claim 1, wherein the column electrodes further include additional row micro-wires that electrically interconnect column micro-wires in a column electrode.

5. The display apparatus of claim 4, wherein the additional row micro-wires located on the column side are located in the row inter-pixel gaps.

6. The display apparatus of claim 1, wherein the row micro-wires substantially extend continuously along the row electrode length in a straight line.

7. The display apparatus of claim 1, wherein the row micro-wires substantially extend continuously along the row electrode length in a crenellated pattern and alternating columns of pixels are offset so that the rows of pixels form a crenellated pattern.

8. The display apparatus of claim 1, wherein the column micro-wires substantially extend continuously along the column electrode length in a straight line.

9. The display apparatus of claim 1, wherein the column micro-wires substantially extend continuously along the column electrode length in a crenellated pattern and alternating rows of pixels are offset so that the columns of pixels form a crenellated pattern.

10. The display apparatus of claim 1, wherein the display includes a cover through which pixel light is emitted and the dielectric layer is the cover.

11. The display apparatus of claim 1, wherein the display includes a cover through which pixel light is emitted or reflected and the row or column electrodes are formed on the cover or wherein the display includes a substrate through which pixel light is emitted and the row or column electrodes are formed on the substrate.

12. The display apparatus of claim 1, wherein the micro-wires are the only conductive element in the row electrodes or in the column electrodes.

13. The display apparatus of claim 12, wherein only the micro-wires operate to form an electrical field when a voltage differential is applied between the row electrodes and the column electrodes.

14. A display apparatus, comprising:
   a display including an array of pixels formed in rows and columns, the pixels in a row separated by column inter-pixel gaps and the pixels in a column separated by row inter-pixel gaps;
   a capacitive touch-screen including a dielectric layer located over the display, the touch screen having row electrodes located on a row side of the dielectric layer and column electrodes located on a column side of the dielectric layer, the row and column electrodes separated by the dielectric layer;
   pixel micro-wires located only partially and exclusively over one or more pixels and electrically connecting row micro-wires in a row electrode;
   wherein the row electrodes include a plurality of electrically connected row micro-wires formed in a row micro-pattern over the array of pixels, the row micro-wires located between the pixels in the row inter-pixel gaps and substantially extending continuously along the row electrode length;
   wherein the row electrodes each include a first micro-wire located in a first inter-pixel gap and a second micro-wire different from the first micro-wire located in a second inter-pixel gap different from the first inter-pixel gap;
   wherein the column electrodes include a plurality of electrically connected column micro-wires formed in a column micro-pattern over the array of pixels, the column micro-wires located between the pixels in the column inter-pixel gaps and substantially extending continuously along the column electrode length;
   wherein the column electrodes each include a first micro-wire located in a first inter-pixel gap and a second micro-wire different from the first micro-wire located in a second inter-pixel gap different from the first inter-pixel gap; and
   wherein the row and column electrodes form an array of capacitors.

15. The display apparatus of claim 14, wherein the row micro-wires are wider than the pixel micro-wires.

16. The display apparatus of claim 14 wherein the pixel micro-wires are at a non-orthogonal angle to the row micro-wires.

17. A display apparatus, comprising:
   a display including an array of pixels formed in rows and columns, the pixels in a row separated by column inter-pixel gaps and the pixels in a column separated by row inter-pixel gaps;
   a capacitive touch-screen including a dielectric layer located over the display, the touch screen having row electrodes located on a row side of the dielectric layer and column electrodes located on a column side of the dielectric layer, the row and column electrodes separated by the dielectric layer;
   pixel micro-wires located only partially and exclusively over one or more pixels and electrically connecting column micro-wires in a column electrode;
   wherein the row electrodes include a plurality of electrically connected row micro-wires formed in a row micro-pattern over the array of pixels, the row micro-wires located between the pixels in the row inter-pixel gaps and substantially extending continuously along the row electrode length;
   wherein the row electrodes each include a first micro-wire located in a first inter-pixel gap and a second micro-wire different from the first micro-wire located in a second inter-pixel gap different from the first inter-pixel gap;
   wherein the column electrodes include a plurality of electrically connected column micro-wires formed in a column micro-pattern over the array of pixels, the column micro-wires located between the pixels in the column inter-pixel gaps and substantially extending continuously along the column electrode length;
   wherein the column electrodes each include a first micro-wire located in a first inter-pixel gap and a second micro-wire different from the first micro-wire located in a second inter-pixel gap different from the first inter-pixel gap; and
   wherein the row and column electrodes form an array of capacitors.

18. The display apparatus of claim 17, wherein the column micro-wires are wider than the pixel micro-wires.

19. The display apparatus of claim 17, wherein the pixel micro-wires are at a non-orthogonal angle to the column micro-wires.

20. The display apparatus of claim 17, further including pixel micro-wires electrically connecting row micro-wires in a row electrode, and wherein the pixel micro-wires electrically connecting row micro-wires in the row electrode are parallel to the pixel micro-wires electrically connecting column micro-wires in the column electrode.

* * * * *